(12) United States Patent
Kim

(10) Patent No.: US 11,514,978 B2
(45) Date of Patent: Nov. 29, 2022

(54) ELECTRONIC DEVICES MITIGATING DEGRADATION OF MOS TRANSISTORS

(71) Applicant: SK hynix Inc., Icheon-si (KR)

(72) Inventor: Woongrae Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/158,789

(22) Filed: Jan. 26, 2021

(65) Prior Publication Data
US 2022/0051715 A1 Feb. 17, 2022

(30) Foreign Application Priority Data
Aug. 12, 2020 (KR) .................. 10-2020-0100978

(51) Int. Cl.
*G11C 11/4096* (2006.01)
*G11C 11/4078* (2006.01)
*G11C 11/4074* (2006.01)
*G11C 11/406* (2006.01)

(52) U.S. Cl.
CPC ...... *G11C 11/4096* (2013.01); *G11C 11/4074* (2013.01); *G11C 11/4078* (2013.01); *G11C 11/40615* (2013.01)

(58) Field of Classification Search
CPC .......... G11C 11/4096; G11C 11/40615; G11C 11/4074; G11C 11/4078
USPC ....................................................... 365/194
See application file for complete search history.

(56) References Cited

U.S. PATENT DOCUMENTS

| 8,552,793 B2 | 10/2013 | Shimogawa et al. | |
| 2005/0046465 A1* | 3/2005 | Kim ...................... | H02M 3/073 327/536 |
| 2007/0070714 A1* | 3/2007 | Jang ........................ | G11C 7/22 365/189.05 |

FOREIGN PATENT DOCUMENTS

KR 1020160107842 A 9/2016

\* cited by examiner

*Primary Examiner* — Huan Hoang
(74) *Attorney, Agent, or Firm* — William Park & Associates Ltd.

(57) ABSTRACT

An electronic device includes a flag generation circuit and a delay circuit. The flag generation circuit is configured to generate a flag signal, wherein a level of the flag signal changes based on a first internal command. The delay circuit is configured to generate a delay signal by delaying one of an operation signal and the flag signal by a predetermined period according to whether a predetermined operation is performed.

20 Claims, 29 Drawing Sheets

__US 11,514,978 B2__

ELECTRONIC DEVICES MITIGATING DEGRADATION OF MOS TRANSISTORS

CROSS-REFERENCE TO RELATED APPLICATIONS

The present application claims priority under 35 U.S.C. 119(a) to Korean Application No. 10-2020-0100978, filed on Aug. 12, 2020, which is incorporated herein by reference in its entirety.

BACKGROUND

1. Technical Field

Embodiments of the present disclosure relate to electronic devices mitigating degradation of MOS transistors.

2. Related Art

Metal-oxide-semiconductor (MOS) transistors included in electronic devices may be subject to a bias temperature instability (BTI) phenomenon in that absolute threshold voltages of the MOS transistors increase as time elapses. The BTI phenomenon may include a negative bias temperature instability (NBTI) phenomenon in that an absolute threshold voltage of PMOS transistors increase as time elapses and a positive bias temperature instability (PBTI) phenomenon in that a threshold voltage of NMOS transistors increases as time elapses.

Electronic semiconductor devices may perform various internal operations according to commands provided by a controller. The semiconductor devices may perform a read operation for outputting data stored in memory cells and may also perform a mode register read operation for outputting operation information and internal information stored in a mode register. In addition, dynamic random access memory (DRAM) devices corresponding to volatile memory devices of the semiconductor devices may perform a refresh operation for restoring data in memory cells after storing the data into the memory cells to prevent the data stored in the memory cells from being lost and may also perform a self-refresh operation for internally and periodically performing the refresh operation.

SUMMARY

According to an embodiment, an electronic device includes a flag generation circuit and a delay circuit. The flag generation circuit is configured to generate a flag signal, wherein a level of the flag signal changes based on a first internal command. The delay circuit is configured to generate a delay signal by delaying one of an operation signal and the flag signal by a predetermined period according to whether a predetermined operation is performed.

According to another embodiment, an electronic device includes an input/output (I/O) control signal generation circuit, a delay circuit, and an output control circuit. The I/O control signal generation circuit is configured to generate an input control signal and an output control signal when a read operation or a mode register read operation is performed. The delay circuit is configured to generate a delay signal by delaying one of a mode register operation signal for the mode register read operation and a flag signal by a predetermined period based on the input control signal. The output control circuit is configured to generate, from the delay signal based on the output control signal, a mode register control signal for controlling the mode register read operation.

DETAILED DESCRIPTION OF THE EMBODIMENTS

In the description of the following embodiments, when a parameter is referred to as being "predetermined," it may be intended to mean that a value of the parameter is determined in advance of when the parameter is used in a process or an algorithm. The value of the parameter may be set when the process or the algorithm starts or may be set during a period in which the process or the algorithm is executed.

It will be understood that although the terms "first," "second," "third," etc. are used herein to describe various elements, these elements should not be limited by these terms. These terms are only used to distinguish one element from another element. They are not used to indicate a sequence or number of elements. Thus, a first element in some embodiments could be termed a second element in other embodiments without departing from the teachings of the present disclosure, or vice versa.

Further, it will be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

A logic "high" level and a logic "low" level may be used to describe logic levels of electric signals. A signal having a logic "high" level may be distinguished from a signal having a logic "low" level. For example, when a signal having a first voltage corresponds to a signal having a logic "high" level, a signal having a second voltage corresponds to a signal having a logic "low" level. In an embodiment, the logic "high" level may be set as a voltage level which is higher than a voltage level of the logic "low" level. Meanwhile, logic levels of signals may be set to be different or opposite according to different embodiments. For example, a certain signal having a logic "high" level in one embodiment may be set to have a logic "low" level in another embodiment.

Various embodiments of the present disclosure will be described hereinafter in detail with reference to the accompanying drawings. However, the embodiments described herein are for illustrative purposes only and are not intended to limit the scope of the present disclosure.

Figure 1:
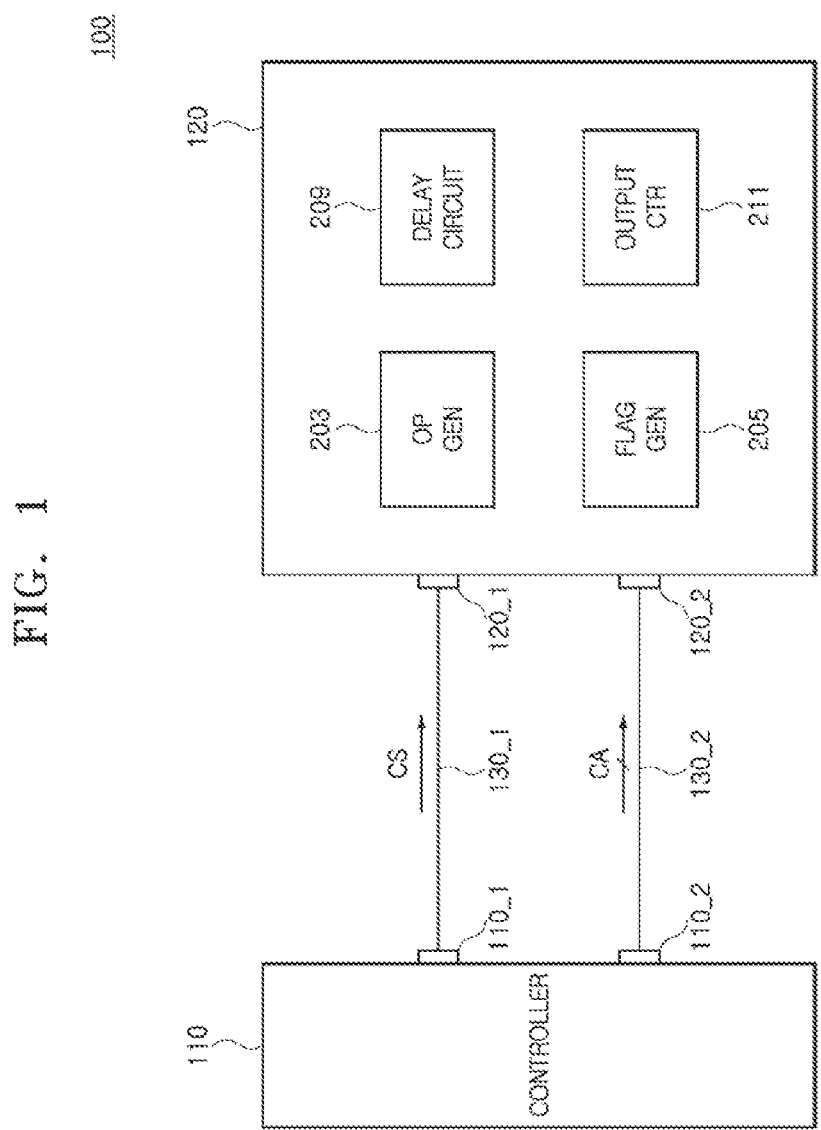
FIG. 1 is a block diagram illustrating a configuration of an electronic system according to an embodiment of the present disclosure.

FIG. 1 is a block diagram illustrating a configuration of an electronic system 100 according to an embodiment of the present disclosure. As illustrated in FIG. 1, the electronic system 100 may include a controller 110 and an electronic device 120.

The controller 110 may include a first control pin 110_1 and a second control pin 110_2. The electronic device 120 may include a first device pin 120_1 and a second device pin 120_2. The controller 110 may transmit a chip selection signal CS to the electronic device 120 through a first transmission line 130_1 connecting the first control pin 110_1 and the first device pin 120_1 to each other. The controller 110 may transmit a command/address signal CA to the electronic device 120 through a second transmission line 130_2 connecting the second control pin 110_2 and the second device pin 120_2 to each other.

The electronic device 120 may include an operation signal generation circuit (OP_GEN) 203, a flag generation circuit (FLAG_GEN) 205, a delay circuit 209, and an output control circuit (OUTPUT_CTR) 211. The electronic device 120 may be realized using a semiconductor device. The electronic device 120 may receive the chip selection signal CS and the command/address signal CA from the controller 110 to perform various internal operations.

The electronic device 120 may include the operation signal generation circuit 203 that generates an operation signal (OP of FIG. 2) for performing a predetermined operation from a first internal command (ICMD1 of FIG. 2) generated based on the chip selection signal CS and the command/address signal CA.

The electronic device 120 may include the flag generation circuit 205 generating a flag signal (FLAG of FIG. 2), a level transition of which occurs whenever a second internal command (ICMD2 of FIG. 2) generated based on the chip selection signal CS and the command/address signal CA is inputted to the flag generation circuit 205.

Figure 2:
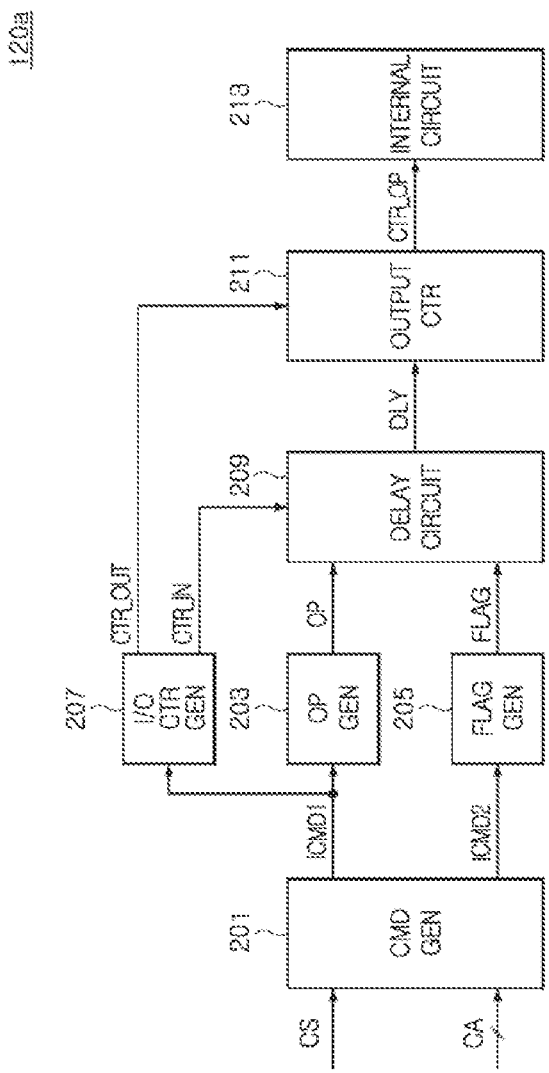
FIG. 2 is a block diagram illustrating a configuration of an electronic device included in the electronic system illustrated in FIG. 1.

The electronic device 120 may include the delay circuit 209 that receives and delays one of the operation signal (OP of FIG. 2) and the flag signal (FLAG of FIG. 2) by a predetermined period to generate a delay signal (DLY of FIG. 2). Thus, the electronic device 120 may change a level of the flag signal (FLAG of FIG. 2) whenever the second internal command (ICMD2 of FIG. 2) is inputted to the flag generation circuit 205 and may apply one of the operation signal (OP of FIG. 2) and the flag signal (FLAG of FIG. 2) to the delay circuit 209 according to whether the predetermined operation is performed. As a result, the degradation of MOS transistors in the electronic device 120 due to the BTI phenomenon may be suppressed or mitigated to increase a lifetime of the electronic device 120, to improve the reliability of operations of the electronic device 120, and to reduce a layout area of a circuit for suppressing or mitigating the BTI phenomenon.

The electronic device 120 may include the output control circuit 211 outputting the delay signal (DLY of FIG. 2) as an operation control signal (CTR_OP of FIG. 2) for controlling the predetermined operation when the predetermined operation is performed.

FIG. 2 is a block diagram illustrating an electronic device 120a corresponding to an example of the electronic device 120. As illustrated in FIG. 2, the electronic device 120a may include a command generation circuit (CMD_GEN) 201, the operation signal generation circuit 203, the flag generation circuit 205, an input/output (I/O) control signal generation circuit (I/O_CTR_GEN) 207, the delay circuit 209, the output control circuit 211, and an internal circuit 213.

The command generation circuit 201 may generate the first internal command ICMD1 based on the chip selection signal CS and the command/address signal CA which have logic levels for performing the predetermined operation. The predetermined operation may be set to be different according to different embodiments. The number of bits included in the command/address signal CA may be set to be different according to different embodiments. Logic levels of the command/address signal CA for performing the predetermined operation may be set to be different according to different embodiments.

The command generation circuit 201 may generate the second internal command ICMD2 based on the chip selection signal CS and the command/address signal CA which have logic levels for performing a self-refresh operation. The second internal command ICMD2 may be enabled to perform the self-refresh operation. Logic levels of the command/address signal CA for performing the self-refresh operation may be set to be different according to different embodiments.

The operation signal generation circuit 203 may generate the operation signal OP from the first internal command ICMD1. The operation signal OP may be enabled when the first internal command ICMD1 for performing the predetermined operation is enabled. The operation signal OP may be generated by delaying the first internal command ICMD1 by a certain period.

The flag generation circuit 205 may generate the flag signal FLAG whose level transition occurs based on the second internal command ICMD2. The flag generation circuit 205 may change a logic level of the flag signal FLAG whenever the second internal command ICMD2 is inputted to the flag generation circuit 205. A level transition of the flag signal FLAG may occur whenever the second internal command ICMD2 is enabled. For example, the flag generation circuit 205 may change a level of the flag signal FLAG from a logic "low" level into a logic "high" level when the second internal command ICMD2 is inputted a first time and may change a level of the flag signal FLAG from a logic "high" level into a logic "low" level when the second internal command ICMD2 is inputted a second time. A configuration and an operation of the flag generation circuit 205 will be described more fully with reference to FIG. 3 later.

The I/O control signal generation circuit 207 may generate an input control signal CTR_IN and an output control signal CTR_OUT based on the first internal command ICMD1. The input control signal CTR_IN may be enabled to control the operation signal OP and the flag signal FLAG inputted to the delay circuit 209 when the predetermined operation is performed. The output control signal CTR_OUT may be enabled to control the operation control signal CTR_OP outputted from the output control circuit 211 when the predetermined operation is performed. The I/O control signal generation circuit 207 may generate an operation enablement signal (OP_EN of FIG. 4) which is enabled while the predetermined operation is performed from a point in time when the first internal command ICMD1 for performing the predetermined operation is enabled. The I/O control signal generation circuit 207 may adjust a pulse width of the operation enablement signal (OP_EN of FIG. 4) to generate the input control signal CTR_IN and the output control signal CTR_OUT having different pulse widths. The input control signal CTR_IN may have a pulse width which is greater than a pulse width of the output control signal CTR_OUT. A configuration and an operation of the I/O control signal generation circuit 207 will be described more fully with reference to FIG. 4 later.

The delay circuit 209 may generate the delay signal DLY by receiving and delaying one of the operation signal OP and the flag signal FLAG by a predetermined period based on the input control signal CTR_IN according to whether the predetermined operation is performed. The delay circuit 209 may generate the delay signal DLY by receiving and delaying the operation signal OP by the predetermined period when the input control signal CTR_IN is enabled. The delay circuit 209 may generate the delay signal DLY by receiving and delaying the flag signal FLAG by the predetermined period when the input control signal CTR_IN is disabled. Thus, the delay circuit 209 may receive one of the operation signal OP, which is generated from the first internal command ICMD1, and the flag signal FLAG, a level transition of which occurs based on the second internal command ICMD2, according to whether the predetermined operation is performed, thereby suppressing that MOS transistors in the electronic device 120a are degraded due to the BTI phenomenon. As a result, it may be possible to increase a lifetime of the electronic device 120a, to improve the reliability of operations of the electronic device 120a, and to reduce a layout area of a circuit for suppressing the BTI phenomenon. A configuration and an operation of the delay circuit 209 will be described more fully with reference to FIG. 5 later.

The output control circuit 211 may generate the operation control signal CTR_OP from the delay signal DLY based on the output control signal CTR_OUT. The operation control signal CTR_OP may be enabled to control the predetermined operation. The output control circuit 211 may output the delay signal DLY as the operation control signal CTR_OP or may disable the operation control signal CTR_OP, based on the output control signal CTR_OUT according to whether the predetermined operation is performed. The output control circuit 211 may output the delay signal DLY as the operation control signal CTR_OP when the output control signal CTR_OUT is enabled. The output control circuit 211 may disable the operation control signal CTR_OP when the output control signal CTR_OUT is disabled. A configuration and an operation of the output control circuit 211 will be described more fully with reference to FIG. 8 later.

The internal circuit 213 may receive the operation control signal CTR_OP to perform the predetermined operation. The internal circuit 213 may be designed to perform the predetermined operation.

Figure 3:
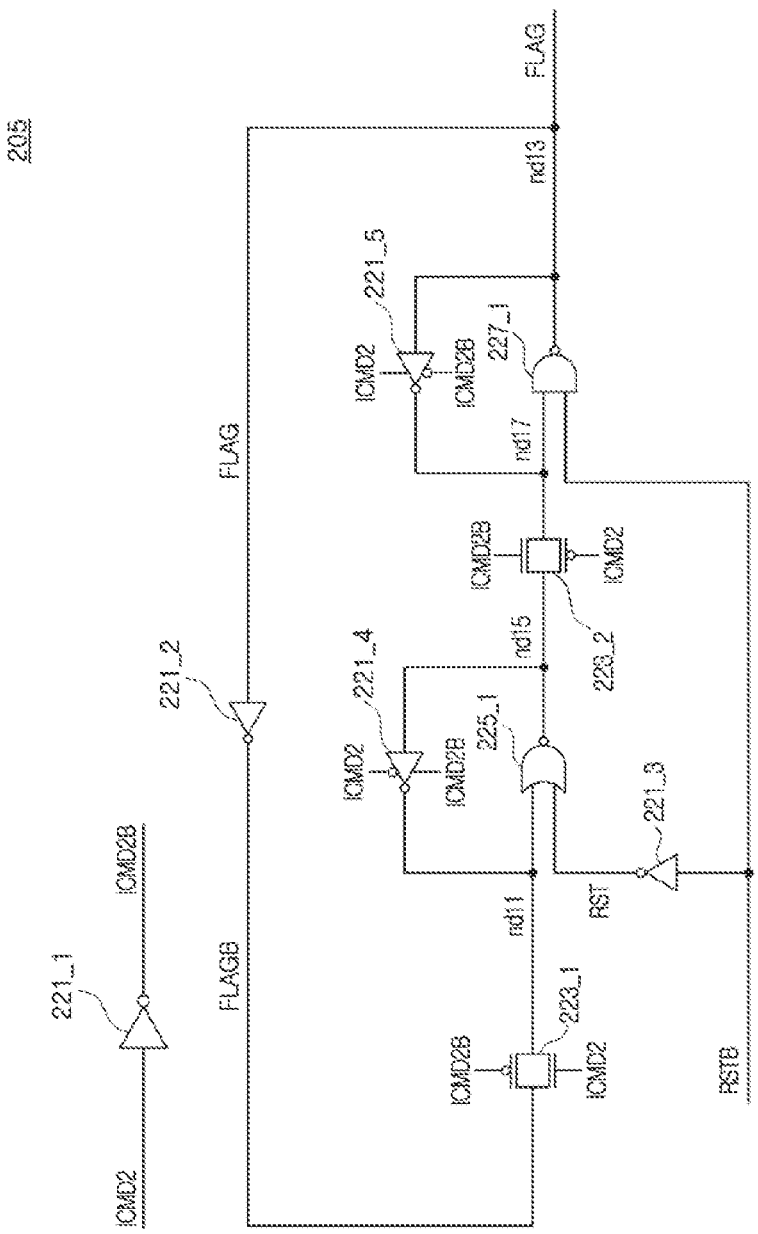
FIG. 3 is a circuit diagram illustrating a configuration of a flag generation circuit included in the electronic device illustrated in FIG. 2.

FIG. 3 is a circuit diagram illustrating a configuration of the flag generation circuit 205 included in the electronic device 120a. As illustrated in FIG. 3, whenever the second internal command ICMD2 is inputted to the flag generation circuit 205, the flag generation circuit 205 may feedback an inverted flag signal FLAGB generated by inverting a level of the flag signal FLAG to an input terminal of the flag generation circuit 205 and may output the inverted flag signal FLAGB as the flag signal FLAG. The flag generation circuit 205 may feedback the inverted flag signal FLAGB generated by inverting a level of the flag signal FLAG to an input node nd11 when the second internal command ICMD2 is enabled. The flag generation circuit 205 may output the inverted flag signal FLAGB, which is fed back to the input node nd11, as the flag signal FLAG through an output node nd13 when the second internal command ICMD2 is disabled.

The flag generation circuit 205 may include inverters 221_1, 221_2, 221_3, 221_4, and 221_5, transfer gates 223_1 and 223_2, a NOR gate 225_1, and a NAND gate 227_1. The inverter 221_1 may inversely buffer the second internal command ICMD2 to generate a second inverted internal command ICMD2B. The inverter 221_2 may inversely buffer the flag signal of the output node nd13 to generate the inverted flag signal FLAGB.

The transfer gate 223_1 may feedback the inverted flag signal FLAGB to the input node nd11 when the second internal command ICMD2 is enabled to have a logic "high" level and the second inverted internal command ICMD2B is disabled to have a logic "low" level. The inverter 221_3 may inversely buffer an inverted reset signal RSTB to generate a reset signal RST. The inverted reset signal RSTB may be generated to have a logic "low" level for execution of an initialization operation. The NOR gate 225_1 may receive a signal of the input node nd11 and the reset signal RST to perform a logical NOR operation of the signal of the input node nd11 and the reset signal RST and may output a result of the logical NOR operation through a first internal node nd15. The inverter 221_4 may inversely buffer a signal of the first internal node nd15 to feedback the inversely buffered signal of the signal of the first internal node nd15 to the input node nd11 when the second inverted internal command ICMD2B is enabled to have a logic "high" level. The inverter 221_4 may be enabled when the second internal command ICMD2 is disabled to have a logic "low" level and the second inverted internal command ICMD2B is enabled to have a logic "high" level.

The transfer gate 223_2 may output a signal of the first internal node nd15 to a second internal node nd17 when the second internal command ICMD2 is disabled to have a logic "low" level and the second inverted internal command ICMD2B is enabled to have a logic "high" level. The NAND gate 227_1 may perform a logical NAND operation of the inverted reset signal RSTB and a signal of the second internal node nd17 to output a result of the logical NAND operation to the output node nd13. The inverter 221_5 may inversely buffer a signal of the output node nd13 to feedback the inversely buffered signal of the signal of the output node nd13 to the second internal node nd17 when the second internal command ICMD2 is enabled to have a logic "high" level. The inverter 221_5 may be enabled when the second internal command ICMD2 is enabled to have a logic "high" level and the second inverted internal command ICMD2B is disabled to have a logic "low" level.

Figure 4:
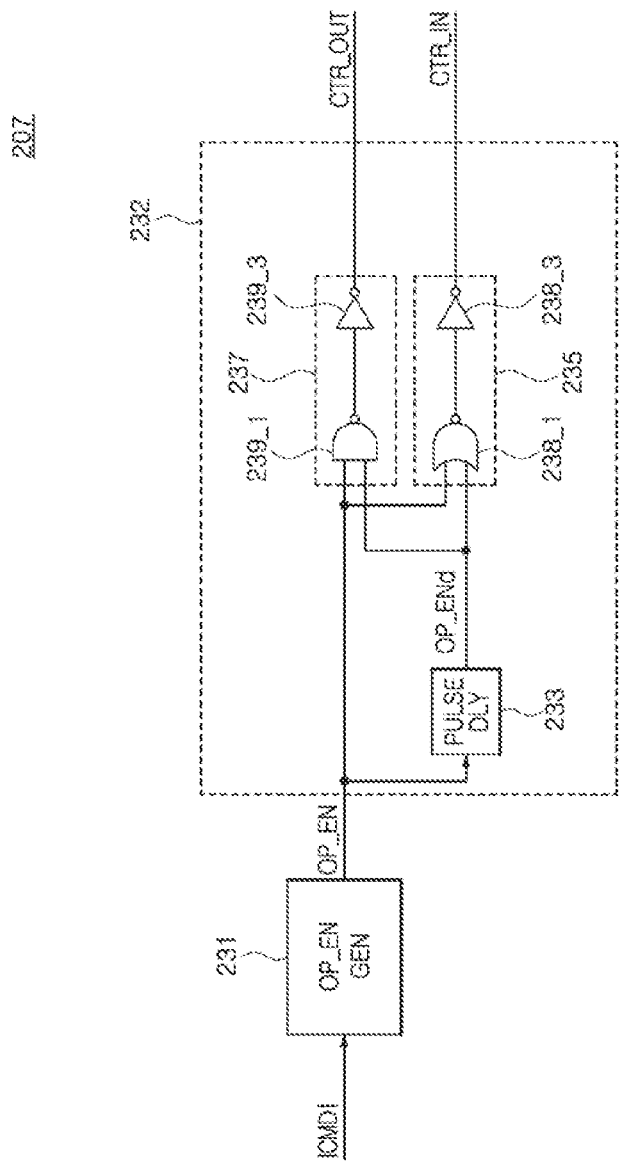
FIG. 4 illustrates a configuration of an input/output (I/O) control signal generation circuit included in the electronic device illustrated in FIG. 2.

FIG. 4 illustrates a configuration of the I/O control signal generation circuit 207 included in the electronic device 120a. As illustrated in FIG. 4, the I/O control signal generation circuit 207 may include an operation enablement signal generation circuit 231 and a pulse width adjustment circuit 232.

The operation enablement signal generation circuit 231 may generate the operation enablement signal OP_EN when the first internal command ICMD1 is enabled. The operation enablement signal OP_EN may be enabled while the predetermined operation is performed.

The pulse width adjustment circuit 232 may include a pulse delay circuit (PULSE_DLY) 233, an input control signal generation circuit 235, and an output control signal generation circuit 237. The pulse width adjustment circuit 232 may generate the input control signal CTR_IN and the output control signal CTR_OUT based on the operation enablement signal OP_EN. The pulse width adjustment circuit 232 may delay the operation enablement signal OP_EN by a certain period to generate a delayed operation enablement signal OP_ENd. The pulse width adjustment circuit 232 may generate the input control signal CTR_IN having a pulse width which is greater than a pulse width of the operation enablement signal OP_EN based on the operation enablement signal OP_EN and the delayed operation enablement signal OP_ENd. The pulse width adjustment circuit 232 may generate the output control signal CTR_OUT having a pulse width which is less than a pulse width of the operation enablement signal OP_EN based on the operation enablement signal OP_EN and the delayed operation enablement signal OP_ENd. That is, the input control signal CTR_IN may have a pulse width which is greater than a pulse width of the output control signal CTR_OUT.

The pulse delay circuit 233 may delay the operation enablement signal OP_EN by a certain period to generate the delayed operation enablement signal OP_ENd.

The input control signal generation circuit 235 may generate the input control signal CTR_IN based on the operation enablement signal OP_EN and the delayed operation enablement signal OP_ENd. The input control signal generation circuit 235 may generate the input control signal CTR_IN which is enabled when at least one of the operation enablement signal OP_EN and the delayed operation enablement signal OP_ENd is enabled. The input control signal generation circuit 235 may include a NOR gate 238_1 and an inverter 238_3 which are coupled in series. The NOR gate 238_1 may receive the operation enablement signal OP_EN and the delayed operation enablement signal OP_End to perform a logical NOR operation of the operation enablement signal OP_EN and the delayed operation enablement signal OP_ENd. The inverter 238_3 may inversely buffer an output signal of the NOR gate 238_1 to generate the input control signal CTR_IN.

The output control signal generation circuit 237 may generate the output control signal CTR_OUT based on the operation enablement signal OP_EN and the delayed operation enablement signal OP_ENd. The output control signal generation circuit 237 may generate the output control signal CTR_OUT which is enabled when both of the operation enablement signal OP_EN and the delayed operation enablement signal OP_ENd are enabled. The output control signal generation circuit 237 may include a NAND gate 239_1 and an inverter 239_3 which are coupled in series. The NAND gate 2391 may receive the operation enablement signal OP_EN and the delayed operation enablement signal OP_End to perform a logical NAND operation of the operation enablement signal OP_EN and the delayed operation enablement signal OP_ENd. The inverter 239_3 may inversely buffer an output signal of the NAND gate 239_1 to generate the output control signal CTR_OUT.

Figure 5:
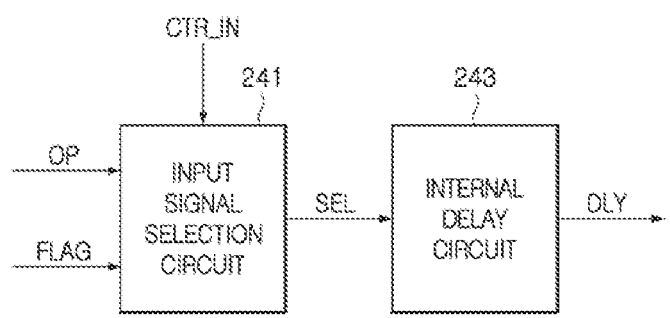
FIG. 5 is a block diagram illustrating a configuration of a delay circuit included in the electronic device illustrated in FIG. 2.

FIG. 5 is a block diagram illustrating a configuration of the delay circuit 209 included in the electronic device 120a. As illustrated in FIG. 5, the delay circuit 209 may include an input signal selection circuit 241 and an internal delay circuit 243.

The input signal selection circuit 241 may output one of the operation signal OP and the flag signal FLAG as a selection signal SEL based on the input control signal CTR_IN. The input signal selection circuit 241 may output the operation signal OP as the selection signal SEL when the input control signal CTR_IN is enabled. The input signal selection circuit 241 may output the flag signal FLAG as the selection signal SEL when the input control signal CTR_IN is disabled. A configuration and an operation of the input signal selection circuit 241 will be described more fully with reference to FIG. 6 later.

The internal delay circuit 243 may delay the selection signal SEL by a predetermined period to generate the delay signal DLY. A configuration and an operation of the internal delay circuit 243 will be described more fully with reference to FIG. 7 later.

Figure 6:
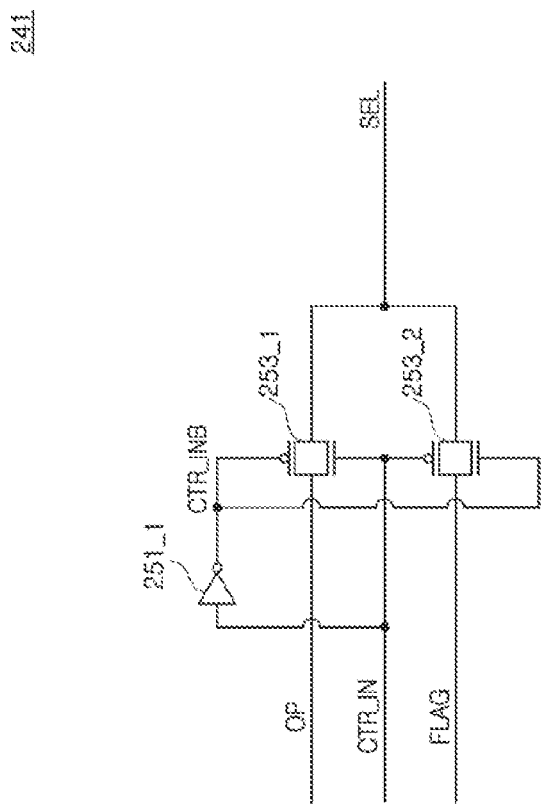
FIG. 6 is a circuit diagram illustrating a configuration of an input signal selection circuit included in the delay circuit illustrated in FIG. 5.

FIG. 6 is a circuit diagram illustrating a configuration of the input signal selection circuit 241 included in the delay circuit 209. As illustrated in FIG. 6, the input signal selection circuit 241 may include an inverter 251_1 and transfer gates 253_1 and 253_2.

The inverter 251_1 may inversely buffer the input control signal CTR_IN to generate an inverted input control signal CTR_INB. The transfer gate 253_1 may output the operation signal OP as the selection signal SEL when the input control signal CTR_IN is enabled to have a logic "high" level and the Inverted input control signal CTR_INB is disabled to have a logic "low" level. The transfer gate 253_2 may output the flag signal FLAG as the selection signal SEL when the input control signal CTR_IN is disabled to have a logic "low" level and the inverted input control signal CTR_INB is enabled to have a logic "high" level.

Figure 7:
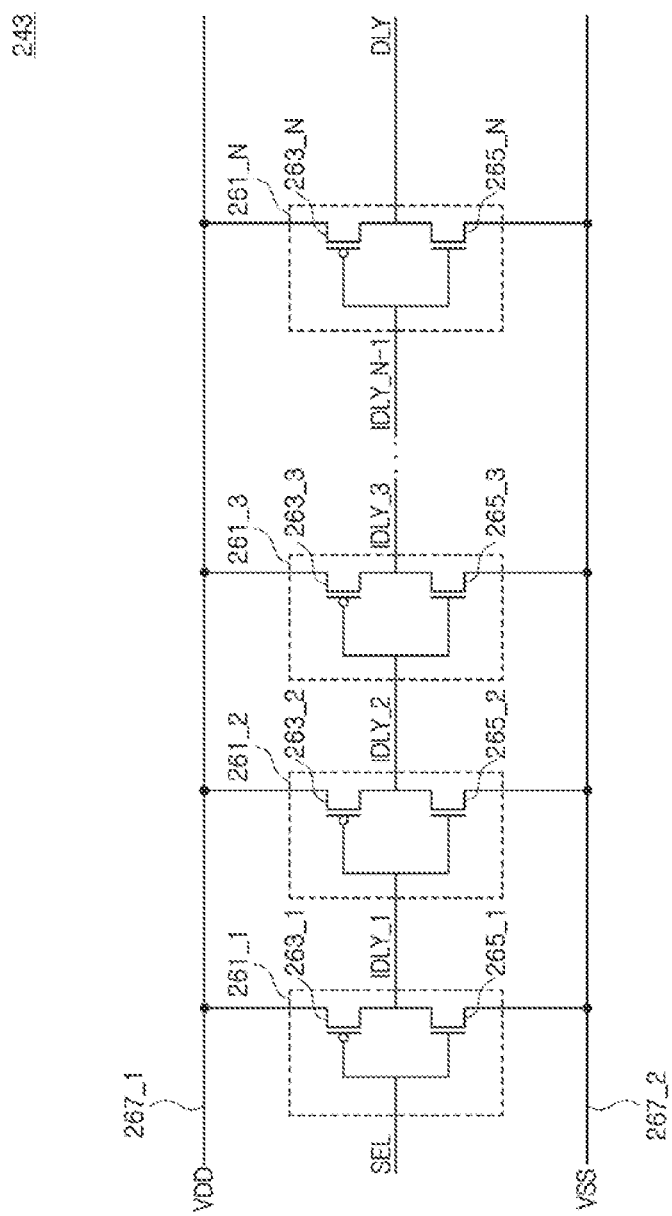
FIG. 7 is a circuit diagram illustrating a configuration of an internal delay circuit included in the delay circuit illustrated in FIG. 5.

FIG. 7 is a circuit diagram illustrating a configuration of the internal delay circuit 243 included in the delay circuit 209. As illustrated in FIG. 7, the internal delay circuit 243 may include a plurality of unit delay circuits (e.g., first to $N^{th}$ unit delay circuits 261_1~261_N) and first to second voltage supply lines 267_1 and 267_2 (where, "N" is set to be a natural number which is equal to or greater than four).

Each of the plurality of unit delay circuits 261_1~261_N may inversely buffer an input signal thereof to output an output signal thereof which is delayed by a certain period as compared with the input signal. Each of the plurality of unit delay circuits 261_1~261_N may be realized using an inverter. Each of the plurality of unit delay circuits 261_1~261_N may include a first MOS transistor and a second MOS transistor which are coupled in series. The first MOS transistor may be realized using a PMOS transistor, and the second MOS transistor may be realized using an NMOS transistor. In each of the plurality of unit delay circuits 261_1~261_N, a gate terminal of the first MOS transistor may be coupled to a gate terminal of the second MOS transistor. One of the first MOS transistor and the second MOS transistor may be selectively turned on according to a level of the input signal applied to the gate terminals of the first MOS transistor and the second MOS transistor. In each of the plurality of unit delay circuits 261_1~261_N, a source terminal of the first MOS transistor may be coupled to the first voltage supply line 267_1 for supplying a first external voltage VDD, and a drain terminal of the first MOS transistor may be coupled to a drain terminal of the second MOS transistor. In addition, a source terminal of the second MOS transistor may be coupled to the second voltage supply line 267_2 for supplying a second external voltage VSS. The first external voltage VDD and the second external voltage VSS may be provided through power pads (not shown) of the electronic device 120a, respectively.

The first unit delay circuit 261_1 may inversely buffer the selection signal SEL to generate a first internal delay signal IDLY_1 which is delayed by a certain period as compared with the selection signal SEL. The first unit delay circuit 261_1 may include a first MOS transistor 263_1 and a second MOS transistor 265_1 coupled in series between the first voltage supply line 267_1 and the second voltage supply line 267_2. One of the first MOS transistor 263_1 and the second MOS transistor 265_1 may be selectively turned on according to a level of the selection signal SEL.

The second unit delay circuit 261_2 may inversely buffer the first internal delay signal IDLY_1 to generate a second internal delay signal IDLY_2 which is delayed by a certain period as compared with the first internal delay signal IDLY_1. The second unit delay circuit 261_2 may include a first MOS transistor 263_2 and a second MOS transistor 265_2 coupled in series between the first voltage supply line 267_1 and the second voltage supply line 267_2. One of the first MOS transistor 263_2 and the second MOS transistor 265_2 may be selectively turned on according to a level of the first internal delay signal IDLY_1. The first MOS transistor 263_2 may be turned on when the second MOS transistor 265_1 is turned on. The second MOS transistor 265_2 may be turned on when the first MOS transistor 263_1 is turned on.

The third unit delay circuit 261_3 may inversely buffer the second internal delay signal IDLY_2 to generate a third internal delay signal IDLY_3 which is delayed by a certain period as compared with the second internal delay signal IDLY_2. The third unit delay circuit 261_3 may include a first MOS transistor 263_3 and a second MOS transistor 265_3 coupled in series between the first voltage supply line 267_1 and the second voltage supply line 267_2. One of the first MOS transistor 263_3 and the second MOS transistor 265_3 may be selectively turned on according to a level of the second internal delay signal IDLY_2. The first MOS transistor 263_3 may be turned on when the second MOS transistor 265_2 is turned on. The second MOS transistor 265_3 may be turned on when the first MOS transistor 263_2 is turned on.

The $N^{th}$ unit delay circuit 261_N may inversely buffer an $(N-1)^{th}$ internal delay signal IDLY_(N-1) to generate the delay signal DLY which is delayed by a certain period as compared with the $(N-1)^{th}$ internal delay signal IDLY_(N-1). The $N^{th}$ unit delay circuit 261_N may include a first MOS transistor 263_N and a second MOS transistor 265_N coupled in series between the first voltage supply line 267_1 and the second voltage supply line 267_2.

The first MOS transistor 263_1, the second MOS transistor 265_2, and the first MOS transistor 263_3 included in the internal delay circuit 243 may be turned on when the selection signal SEL has a logic "low" level. In contrast, the second MOS transistor 265_1, the first MOS transistor 263_2, and the second MOS transistor 265_3 included in the internal delay circuit 243 may be turned on when the selection signal SEL has a logic "high" level. That is, when the selection signal SEL continuously has a logic "low" level or a logic "high" level, only some specific MOS transistors among the MOS transistors included in the internal delay circuit 243 may be turned on during a long time so that characteristics of the specific MOS transistors are severely degraded due to the BTI phenomenon.

According to the present embodiment, when the input control signal (CTR_IN of FIG. 5) is disabled, the internal delay circuit 243 may receive the flag signal (FLAG of FIG. 5), which is toggled based on the second internal command (ICMD2 of FIG. 2), as the selection signal SEL to suppress the BTI phenomenon of the specific MOS transistors. As a result, it may be possible to increase a lifetime of the electronic device 120a, to improve the reliability of operations of the electronic device 120a, and to reduce a layout area of an extra circuit for suppressing the BTI phenomenon.

Figure 8:
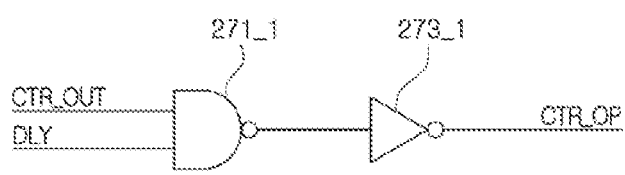
FIG. 8 is a circuit diagram illustrating a configuration of an output control circuit included in the electronic device illustrated in FIG. 2.

FIG. 8 is a circuit diagram illustrating a configuration of the output control circuit 211 included in the electronic device 120a. As illustrated in FIG. 8, the output control circuit 211 may include a NAND gate 271_1 and an inverter 273_1 which are coupled in series.

The NAND gate 271_1 may receive the out control signal CTR_OUT and the delay signal DLY to perform a logical NAND operation of the out control signal CTR_OUT and the delay signal DLY. The inverter 273_1 may inversely buffer an output signal of the NAND gate 271_1 to generate the operation control signal CTR_OP.

As described above, the electronic device 120a may change a level of the flag signal (FLAG of FIG. 2) whenever the second internal command (ICMD2 of FIG. 2) is generated and may apply one of the operation signal (OP of FIG. 2) and the flag signal (FLAG of FIG. 2) to the delay circuit 209 according to whether the predetermined operation is performed. As a result, in the delay circuit 209, degradation of the MOS transistors due to the BTI phenomenon may be suppressed or mitigated to increase a lifetime of the electronic device 120a, to improve the reliability of operations of the electronic device 120a, and to reduce a layout area of an extra circuit for suppressing the BTI phenomenon.

Figure 9:
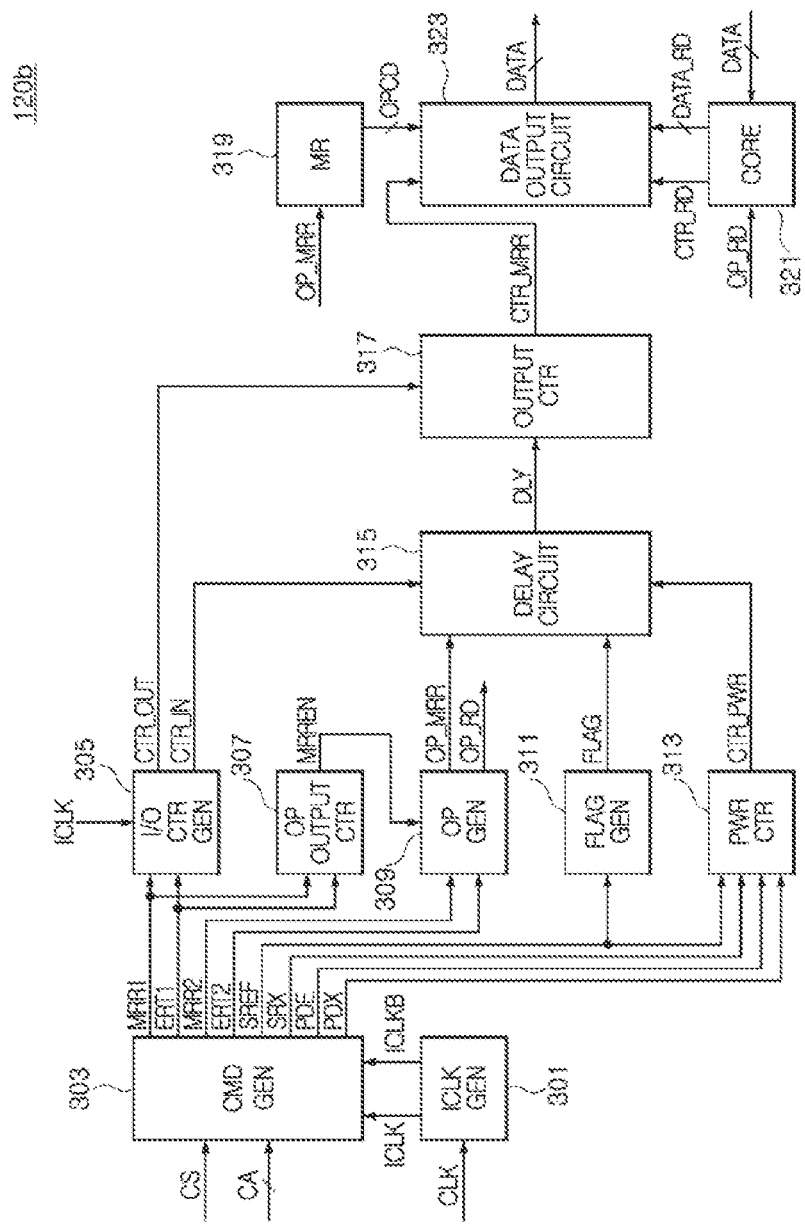
FIG. 9 is a block diagram illustrating a configuration of another example of an electronic device included in the electronic system illustrated in FIG. 1.

FIG. 9 is a block diagram illustrating a configuration of an electronic device 120b corresponding to another example of the electronic device 120 included in the electronic system illustrated in FIG. 1. As illustrated in FIG. 9, the electronic device 120b may include an internal clock generation circuit 301, a command generation circuit 303, an I/O control signal generation circuit 305, an operation signal output control circuit 307, an operation signal generation circuit 309, a flag generation circuit 311, a power controller 313, a delay circuit 315, an output control circuit 317, a mode register 319, a core circuit 321, and a data output circuit 323.

The internal clock generation circuit 301 may generate an internal clock signal ICLK and an inverted internal clock signal ICLKB based on a clock signal CLK. The clock signal CLK may be outputted from the controller (110 of FIG. 1). The internal clock signal ICLK may have the same phase as the clock signal CLK. The inverted internal clock signal ICLKB may have an opposite phase to the clock signal CLK. The phases of the internal clock signal ICLK and the inverted internal clock signal ICLKB may be set to be different according to the embodiment. A frequency of the internal clock signal ICLK and the inverted internal clock signal ICLKB may also be set to be different according to the embodiment. An operation of the internal clock generation circuit 301 for generating the internal clock signal ICLK and the inverted internal clock signal ICLKB will be described with reference to FIG. 10 later.

The command generation circuit 303 may be synchronized with the internal clock signal ICLK and the inverted internal clock signal ICLKB to sequentially generate a first mode register command MRR1 and a second mode register command MRR2 based on a chip selection signal CS and a command/address signal CA which have logic levels for performing a mode register read operation. The first mode register command MRR1 and the second mode register command MRR2 may be enabled to perform the mode register read operation. The first mode register command MRR1 may be generated in synchronization with the internal clock signal ICLK. The second mode register command MRR2 may be generated in synchronization with the inverted internal clock signal ICLKB.

The command generation circuit 303 may be synchronized with the internal clock signal ICLK and the inverted internal clock signal ICLKB to sequentially generate a first read command ERT1 and a second read command ERT2 based on the chip selection signal CS and the command/address signal CA which have logic levels for performing a read operation. The first read command ERT1 and the second read command ERT2 may be enabled to perform the read operation. The first read command ERT1 may be generated in synchronization with the internal clock signal ICLK. The second read command ERT2 may be generated in synchronization with the inverted internal clock signal ICLKB.

The command generation circuit 303 may be synchronized with the internal clock signal ICLK and the inverted internal clock signal ICLKB to generate a self-refresh command SREF and a self-refresh exit command SRX based on the chip selection signal CS and the command/address signal CA. The self-refresh command SREF may be enabled to perform a self-refresh operation. The self-refresh exit command SRX may be enabled to terminate the self-refresh operation.

The command generation circuit 303 may be synchronized with the internal clock signal ICLK to generate a power-down command PDE and a power-down exit command PDX based on the chip selection signal CS and the command/address signal CA. The power-down command PDE may be enabled to perform a power-down operation. The power-down exit command PDX may be enabled to terminate the power-down operation.

The I/O control signal generation circuit 305 may be synchronized with the internal clock signal ICLK to generate an input control signal CTR_IN and an output control signal CTR_OUT based on the first mode register command MRR1 and the first read command ERT1. The input control signal CTR_IN may be enabled to control a mode register operation signal OP_MRR and a flag signal FLAG inputted to the delay circuit 315 when the read operation or the mode register read operation is performed. The output control signal CTR_OUT may be enabled to control a mode register control signal CTR_MRR outputted from the output control circuit 317 when the read operation or the mode register read operation is performed. The I/O control signal generation circuit 305 may generate a read clock enablement signal (RCLKEN of FIG. 12) based on the first mode register command MRR1 and the first read command ERT1 when the read operation or the mode register read operation is performed. The read clock enablement signal (RCLKEN of FIG. 12) may be enabled while a period including a read latency period elapses from a point in time when the first read command ERT1 for performing the read operation or the first mode register command MRR1 for performing the mode register read operation is enabled. The I/O control signal generation circuit 305 may adjust a pulse with of the read clock enablement signal (RCLKEN of FIG. 12) to generate the input control signal CTR_IN and the output control signal CTR_OUT having different pulse widths. The input control signal CTR_IN may have a pulse width which is greater than a pulse width of the output control signal CTR_OUT. A configuration and an operation of the I/O control signal generation circuit 305 will be described more fully with reference to FIG. 12 later.

The operation signal output control circuit 307 may generate a mode register enablement signal MRREN based on the first mode register command MRR1 and the first read command ERT1. The mode register enablement signal MRREN may be enabled when the mode register read operation is performed and may be disabled when the read operation is performed. A configuration and an operation of the operation signal output control circuit 307 will be described more fully with reference to FIG. 14 later.

The operation signal generation circuit 309 may generate the mode register operation signal OP_MRR and a read operation signal OP_RD based on the second mode register command MRR2, the second read command ERT2, and the mode register enablement signal MRREN. The mode register operation signal OP_MRR may be enabled to output an operation code OPCD stored in the mode register 319 when the mode register read operation is performed. The read operation signal OP_RD may be enabled to output storage data (not shown) stored in a cell array (not shown) included in the core circuit 321 as read data DATA_RD when the read operation is performed.

Figure 15:
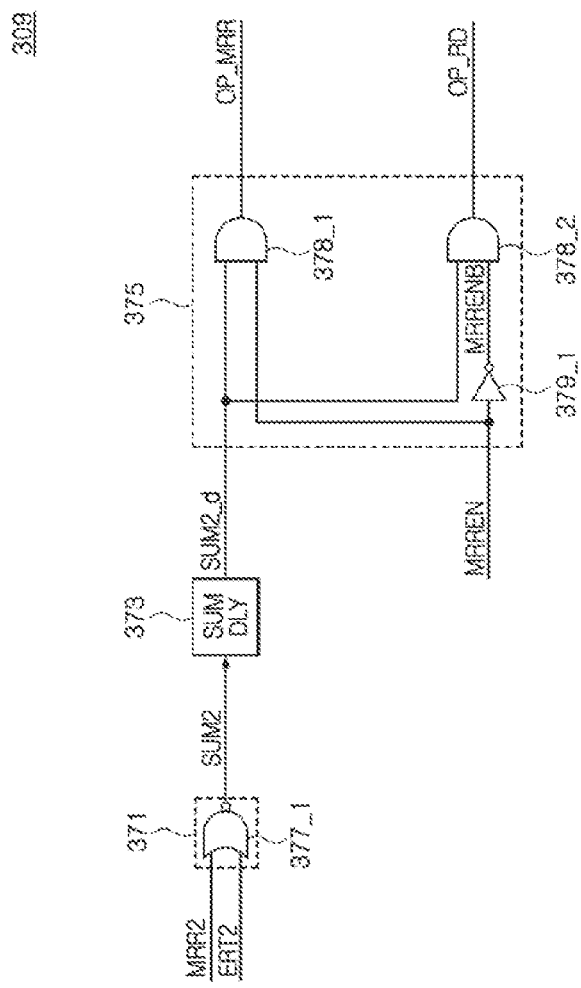
FIG. 15 illustrates a configuration of an operation signal generation circuit included in the electronic device illustrated in FIG. 9.

The operation signal generation circuit 309 may synthesize the second mode register command MRR2 and the second read command ERT2 to generate a second read synthesis signal (SUM2 of FIG. 15). The operation signal generation circuit 309 may enable the mode register operation signal OP_MRR based on the second read synthesis signal (SUM2 of FIG. 15) when the mode register enablement signal MRREN is enabled. The operation signal generation circuit 309 may enable the read operation signal OP_RD based on the second read synthesis signal (SUM2 of FIG. 15) when the mode register enablement signal MRREN is disabled. A configuration and an operation of the operation signal generation circuit 309 will be described more fully with reference to FIG. 15 later.

The flag generation circuit 311 may generate the flag signal FLAG whose level transition occurs based on the self-refresh command SREF. The flag generation circuit 311 may change a level of the flag signal FLAG whenever the self-refresh command SREF is inputted to the flag generation circuit 311. A level of the flag signal FLAG may be changed whenever the self-refresh command SREF is enabled. For example, the flag generation circuit 311 may change a level of the flag signal FLAG from a logic "low" level into a logic "high" level when the self-refresh command SREF is inputted a first time and may change a level of the flag signal FLAG from a logic "high" level into a logic "low" level when the self-refresh command SREF is inputted a second time. A configuration and an operation of the flag generation circuit 311 will be described more fully with reference to FIG. 16 later.

The power controller 313 may generate a power control signal CTR_PWR based on the self-refresh command SREF, the self-refresh exit command SRX, the power-down command PDE, and the power-down exit command PDX. The power control signal CTR_PWR may be enabled to inhibit a power source voltage from being supplied to the delay circuit 315 when the self-refresh operation or the power-down operation is performed. The power control signal CTR_PWR may be disabled to supply the power source voltage to the delay circuit 315 when the self-refresh operation or the power-down operation terminates. A configuration and an operation of the power controller 313 will be described more fully with reference to FIG. 17 later.

The delay circuit 315 may generate a delay signal DLY by receiving and delaying one of the mode register operation signal OP_MRR for the mode register read operation and the flag signal FLAG by a predetermined period based on the power control signal CTR_PWR and the input control signal CTR_IN according to whether the mode register read operation is performed. The predetermined period may be set as a period from a point in time when the read operation signal OP_RD is enabled until a point in time when a read control signal CTR_RD is enabled when the read operation is performed. The delay circuit 315 may generate the delay signal DLY by receiving and delaying the mode register operation signal OP_MRR by the predetermined period when the input control signal CTR_IN is enabled. The delay circuit 315 may generate the delay signal DLY by receiving and delaying the flag signal FLAG by the predetermined period when the input control signal CTR_IN is disabled. Thus, the delay circuit 315 may receive one of the mode register operation signal OP_MRR and the flag signal FLAG whose level transition occurs based on the self-refresh command SREF according to whether the mode register read operation is performed, thereby suppressing that MOS transistors in the electronic device 120b are degraded due to the BTI phenomenon. As a result, it may be possible to increase a lifetime of the electronic device 120b, to improve the reliability of operations of the electronic device 120b, and to reduce a layout area of a circuit for suppressing the BTI phenomenon. A configuration and an operation of the delay circuit 315 will be described more fully with reference to FIG. 18 later.

The output control circuit 317 may generate the mode register control signal CTR_MRR for controlling the mode register read operation from the delay signal DLY based on the output control signal CTR_OUT. The mode register control signal CTR_MRR may be enabled to control the data output circuit 323 outputting the operation code OPCD as data DATA when the mode register read operation is performed. The output control circuit 317 may output the delay signal DLY as the mode register control signal CTR_MRR when the output control signal CTR_OUT is enabled. The output control circuit 317 may disable the mode register control signal CTR_MRR when the output control signal CTR_OUT is disabled. A configuration and an operation of the output control circuit 317 will be described more fully with reference to FIG. 22 later.

The mode register 319 may receive the mode register operation signal OP_MRR to output the operation code OPCD. The mode register 319 may store the operation code OPCD therein. The operation code OPCD may include operation information and internal information of the electronic device 120b. The number of bits included in the operation code OPCD may be set to be different according to different embodiments.

The core circuit 321 may output the read data DATA_RD based on the data DATA and the read operation signal OP_RD. The data DATA may be provided by the controller (110 of FIG. 1). The core circuit 321 may include a plurality of memory cells (not shown) storing the data DATA provided by the controller (110 of FIG. 1) as the storage data (not shown). The core circuit 321 may output the storage data (not shown) as the read data DATA_RD when the read operation signal OP_RD is enabled. The number of bits included in the read data DATA_RD may be set to be different according to different embodiments.

The data output circuit 323 may output the operation code OPCD or the read data DATA_RD as the data DATA based on the mode register control signal CTR_MRR and the read control signal CTR_RD. The data DATA outputted from the data output circuit 323 may be transmitted to the controller (110 of FIG. 1). The data output circuit 323 may output the operation code OPCD as the data DATA when the mode register control signal CTR_MRR is enabled. The data output circuit 323 may output the read data DATA_RD as the data DATA when the read control signal CTR_RD is enabled. A configuration and an operation of the data output circuit 323 will be described more fully with reference to FIG. 23 later.

Figure 10:
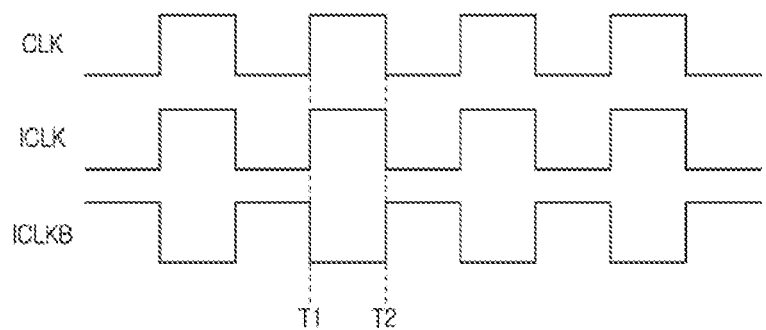
FIG. 10 is a timing diagram illustrating an operation of an internal clock generation circuit included in the electronic device illustrated in FIG. 9.

FIG. 10 is a timing diagram illustrating an operation of the internal clock generation circuit 301 included in the electronic device 120b. Referring to FIG. 10, the internal clock generation circuit 301 may generate the internal clock signal ICLK having the same phase as the clock signal CLK. The internal clock generation circuit 301 may be synchronized with a rising edge T1 of the clock signal CLK to generate the internal clock signal ICLK which is toggled to have a logic "high" level. The internal clock generation circuit 301 may generate the inverted internal clock signal ICLKB having an opposite phase to the clock signal CLK. The internal clock generation circuit 301 may be synchronized with a falling edge T2 of the clock signal CLK to generate the inverted internal clock signal ICLKB which is toggled to have a logic "high" level.

Figure 11:
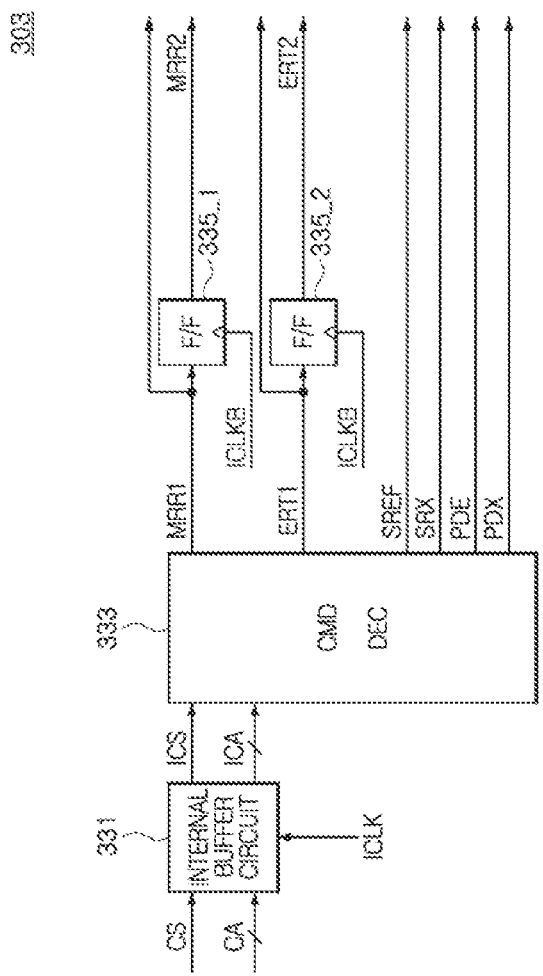
FIG. 11 illustrates a configuration of a command generation circuit included in the electronic device illustrated in FIG. 9.

FIG. 11 illustrates a configuration of the command generation circuit 303 included in the electronic device 120b. As illustrated in FIG. 11, the command generation circuit 303 may include an internal buffer circuit 331, a command decoder (CMD_DEC) 333, and a plurality of flip-flops 335_1 and 335_2.

The internal buffer circuit 331 may be synchronized with a rising edge of the internal clock signal ICLK to generate an internal chip selection signal ICS from the chip selection signal CS. The internal buffer circuit 331 may be synchronized with a rising edge of the internal clock signal ICLK to generate an internal command/address signal ICA from the command/address signal CA. The number of bits included in the internal command/address signal ICA may be set to be different according to different embodiments.

The command decoder 333 may decode the internal chip selection signal ICS and the internal command/address signal ICA to generate the first mode register command MRR1, the first read command ERT1, the self-refresh command SREF, the self-refresh exit command SRX, the power-down command PDE, and the power-down exit command PDX. The first mode register command MRR1 may be generated from the internal chip selection signal ICS and the internal command/address signal ICA which have logic levels for performing the mode register read operation. The first read command ERT1 may be generated from the internal chip selection signal ICS and the internal command/address signal ICA which have logic levels for performing the read operation. The self-refresh command SREF may be generated from the internal chip selection signal ICS and the internal command/address signal ICA which have logic levels for performing the self-refresh operation. The self-refresh exit command SRX may be generated from the internal chip selection signal ICS and the internal command/address signal ICA which have logic levels for terminating the self-refresh operation. The power-down command PDE may be generated from the internal chip selection signal ICS and the internal command/address signal ICA which have logic levels for performing the power-down operation. The power-down exit command PDX may be generated from the internal chip selection signal ICS and the internal command/address signal ICA which have logic levels for terminating the power-down operation.

The flip-flop 335_1 may be synchronized with a rising edge of the inverted internal clock signal ICLKB to latch the first mode register command MRR1 and may output the latched signal of the first mode register command MRR1 as the second mode register command MRR2. The flip-flop 335_2 may be synchronized with a rising edge of the inverted internal clock signal ICLKB to latch the first read command ERT1 and may output the latched signal of the first read command ERT1 as the second read command ERT2.

Figure 12:
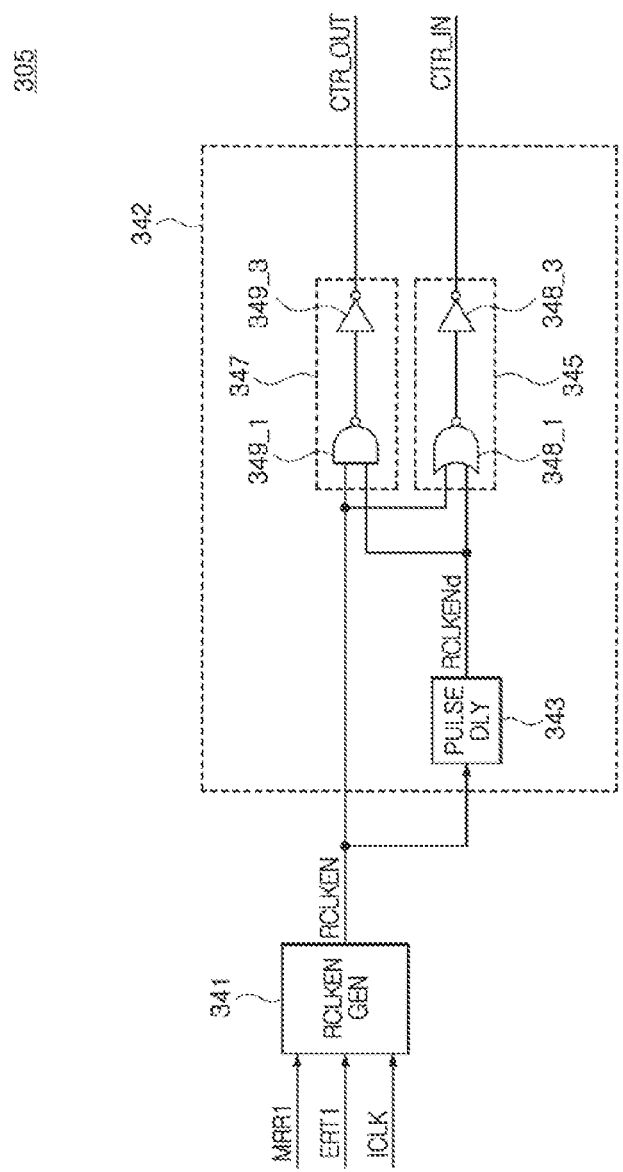
FIG. 12 illustrates a configuration of an I/O control signal generation circuit included in the electronic device illustrated in FIG. 9.

FIG. 12 illustrates a configuration of the I/O control signal generation circuit 305 included in the electronic device 120b. As illustrated in FIG. 12, the I/O control signal generation circuit 305 may include a read enablement signal generation circuit 341 and a pulse width adjustment circuit 342.

The read enablement signal generation circuit 341 may be synchronized with the internal clock signal ICLK to generate the read clock enablement signal RCLKEN based on the first mode register command MRR1 and the first read command ERT1. The read clock enablement signal RCLKEN may be enabled during a period including a read latency period when the read operation or the mode register read operation is performed. A configuration and an operation of the read enablement signal generation circuit 341 will be described more fully with reference to FIG. 13 later.

The pulse width adjustment circuit 342 may include a pulse delay circuit (PULSE_DLY) 343, an input control signal generation circuit 345, and an output control signal generation circuit 347. The pulse width adjustment circuit 342 may generate the input control signal CTR_IN and the output control signal CTR_OUT based on the read clock enablement signal RCLKEN. The pulse width adjustment circuit 342 may delay the read clock enablement signal RCLKEN by a certain period to generate a delayed read clock enablement signal RCLKENd. The pulse width adjustment circuit 342 may generate the input control signal CTR_IN having a pulse width which is greater than a pulse width of the read clock enablement signal RCLKEN based on the read clock enablement signal RCLKEN and the delayed read clock enablement signal RCLKENd. The pulse width adjustment circuit 342 may generate the output control signal CTR_OUT having a pulse width which is less than a pulse width of the read clock enablement signal RCLKEN based on the read clock enablement signal RCLKEN and the delayed read clock enablement signal RCLKENd. That is, the input control signal CTR_IN may have a pulse width which is greater than a pulse width of the output control signal CTR_OUT.

The pulse delay circuit 343 may delay the read clock enablement signal RCLKEN by a certain period to generate the delayed read clock enablement signal RCLKENd.

The input control signal generation circuit 345 may generate the input control signal CTR_IN based on the read clock enablement signal RCLKEN and the delayed read clock enablement signal RCLKENd. The input control signal generation circuit 345 may generate the input control signal CTR_IN which is enabled when at least one of the read clock enablement signal RCLKEN and the delayed read clock enablement signal RCLKENd is enabled. The input control signal generation circuit 345 may include a NOR gate 348_1 and an inverter 348_3 which are coupled in series. The NOR gate 348_1 may receive the read clock enablement signal RCLKEN and the delayed read clock enablement signal RCLKENd to perform a logical NOR operation of the read clock enablement signal RCLKEN and the delayed read clock enablement signal RCLKENd. The inverter 348_3 may inversely buffer an output signal of the NOR gate 348_1 to generate the input control signal CTR_IN.

The output control signal generation circuit 347 may generate the output control signal CTR_OUT based on the read clock enablement signal RCLKEN and the delayed read clock enablement signal RCLKENd. The output control signal generation circuit 347 may generate the output control signal CTR_OUT which is enabled when both of the read clock enablement signal RCLKEN and the delayed read clock enablement signal RCLKENd are enabled. The output control signal generation circuit 347 may include a NAND gate 349_1 and an inverter 349_3 which are coupled in series. The NAND gate 349_1 may receive the read clock enablement signal RCLKEN and the delayed read clock enablement signal RCLKENd to perform a logical NAND operation of the read clock enablement signal RCLKEN and the delayed read clock enablement signal RCLKENd. The inverter 349_3 may inversely buffer an output signal of the NAND gate 349_1 to generate the output control signal CTR_OUT.

Figure 13:
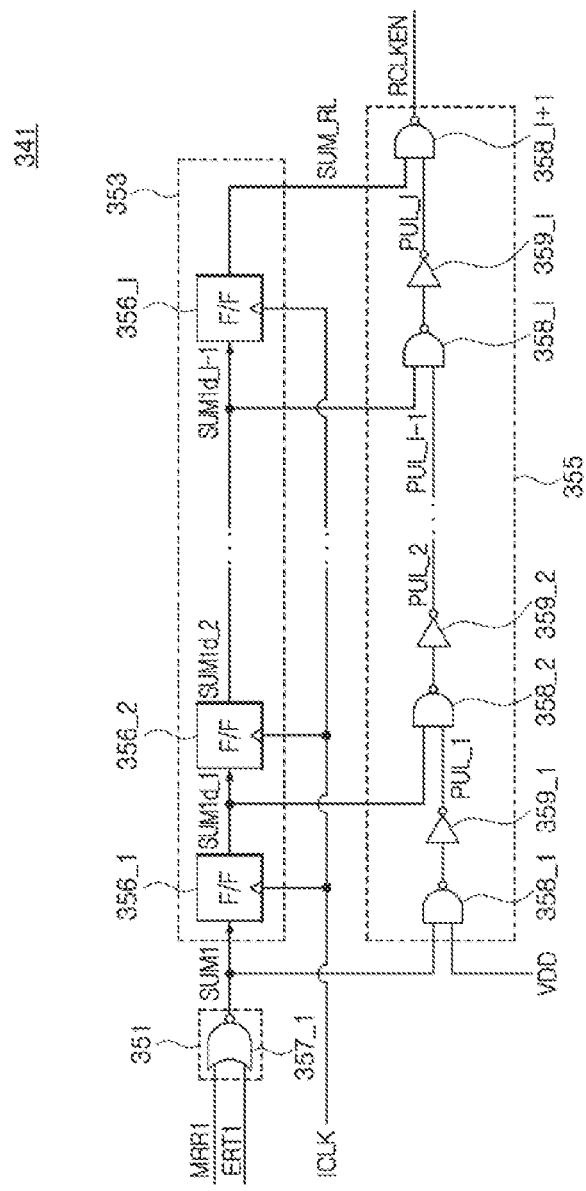
FIG. 13 is a circuit diagram illustrating a configuration of a read enablement signal generation circuit included in the I/O control signal generation circuit illustrated in FIG. 12.

FIG. 13 is a circuit diagram illustrating a configuration of the read enablement signal generation circuit 341 included in the I/O control signal generation circuit 305. As illustrated in FIG. 13, the read enablement signal generation circuit 341 may include a first read command synthesis circuit 351, a read latency shift circuit 353, and a pulse generation circuit 355.

The first read command synthesis circuit 351 may synthesize the first mode register command MRR1 and the first read command ERT1 to generate a first read synthesis signal SUM1. The first read synthesis signal SUM1 may be enabled to generate the read clock enablement signal RCLKEN when the read operation or the mode register read operation is performed. The first read command synthesis circuit 351 may generate the first read synthesis signal SUM1 which is enabled to have a logic "low" level when one of the first mode register command MRR1 and the first read command ERT1 is enabled to have a logic "high" level. The first read command synthesis circuit 351 may include a NOR gate 357_1. The NOR gate 357_1 may perform a logical NOR operation of the first mode register command MRR1 and the first read command ERT1 to generate and output the first read synthesis signal SUM1.

The read latency shift circuit 353 may delay the first read synthesis signal SUM1 by a period including the read latency period in synchronization with the internal clock signal ICLK to generate a latency read signal SUM_RL. The read latency shift circuit 353 may include a plurality of flip-flops 356_1~356_I (where, "I" denotes a natural number which is equal to or greater than three).

The flip-flop 356_1 may delay the first read synthesis signal SUM1 by one cycle of the internal clock signal ICLK in synchronization with the internal clock signal ICLK to generate a first read synthesis delay signal SUM1$d$_1. The flip-flop 356_2 may delay the first read synthesis delay signal SUM1$d$_1 by one cycle of the internal clock signal ICLK in synchronization with the internal clock signal ICLK to generate a second read synthesis delay signal SUM1$d$_2. The flip-flop 356_I may delay a $(I-1)^{th}$ read synthesis delay signal SUM1$d$_I-1 by one cycle of the internal clock signal ICLK in synchronization with the internal clock signal ICLK to generate the latency read signal SUM_RL.

The pulse generation circuit 355 may synthesize the first read synthesis signal SUM1, the first to $(I-1)^{th}$ read synthesis delay signals SUM1$d$_1~SUM1$d$_I-1, and the latency read signal SUM_RL to generate the read clock enablement signal RCLKEN. The pulse generation circuit 355 may include NAND gates 358_1~358_I+1 and inverters 359_1~359_I.

The NAND gate 358_1 may receive the first external voltage VDD and the first read synthesis signal SUM1 to perform a logical NAND operation of the first external voltage VDD and the first read synthesis signal SUM1. The first external voltage VDD may be provided through a power pad (not shown). The inverter 359_1 may inversely buffer an output signal of the NAND gate 358_1 to generate a first read pulse PUL_1. The NAND gate 358_2 may receive the first read pulse PUL_1 and the first read synthesis delay signal SUM1$d$_1 to perform a logical NAND operation of the first read pulse PUL_1 and the first read synthesis delay signal SUM1$d$_1. The inverter 359_2 may inversely buffer an output signal of the NAND gate 358_2 to generate a second read pulse PUL_2. The NAND gate 358_I may receive the $(I-1)^{th}$ read pulse PUL_I-1 and the $(I-1)^{th}$ read synthesis delay signal SUM1$d$_I-1 to perform a logical NAND operation of the $(I-1)^{th}$ read pulse PUL_I-1 and the $(I-1)^{th}$ read synthesis delay signal SUM1$d$_I-1. The inverter 359_I may inversely buffer an output signal of the NAND gate 358_I to generate an $I^{th}$ read pulse PUL_I. The NAND gate 358_I+1 may perform a logical NAND operation of the $I^{th}$ read pulse PUL_I and the latency read signal SUM_RL to generate the read clock enablement signal RCLKEN.

Figure 14:
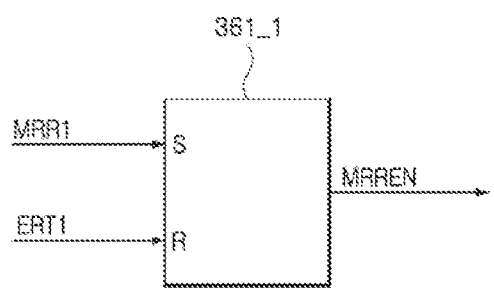
FIG. 14 is a circuit diagram illustrating a configuration of an operation signal output control circuit included in the electronic device illustrated in FIG. 9.

FIG. 14 is a circuit diagram illustrating a configuration of the operation signal output control circuit 307 included in the electronic device 120$b$. Referring to FIG. 14, the operation signal output control circuit 307 may generate the mode register enablement signal MRREN which is enabled when the mode register read operation is performed and which is disabled when the read operation is performed. The operation signal output control circuit 307 may include an S-R latch 361_1. The S-R latch 361_1 may output the mode register enablement signal MRREN which is enabled to have a logic "high" level when the first mode register command MRR1 is enabled to have a logic "high" level and which is disabled to have a logic "low" level when the first read command ERT1 is enabled to have a logic "high" level.

FIG. 15 illustrates a configuration of the operation signal generation circuit 309 included in the electronic device 120$b$. As illustrated in FIG. 15, the operation signal generation circuit 309 may include a second read command synthesis circuit 371, a synthesis signal delay circuit (SUM_DLY) 373, and an operation signal output circuit 375.

The second read command synthesis circuit 371 may synthesize the second mode register command MRR2 and the second read command ERT2 to generate the second read synthesis signal SUM2. The second read synthesis signal SUM2 may be enabled to generate the read operation signal OP_RD and the mode register operation signal OP_MRR. The second read command synthesis circuit 371 may generate the second read synthesis signal SUM2 which is enabled to have a logic "low" level when one of the second mode register command MRR2 and the second read command ERT2 is enabled to have a logic "high" level. The second read command synthesis circuit 371 may include a NOR gate 377_1. The NOR gate 377_1 may perform a logical NOR operation of the second mode register command MRR2 and the second read command ERT2 to generate and output the second read synthesis signal SUM2.

The synthesis signal delay circuit 373 may delay the second read synthesis signal SUM2 by a certain period to generate a second read synthesis delay signal SUM2_$d$.

The operation signal output circuit 375 may generate the mode register operation signal OP_MRR and the read operation signal OP_RD based on the second read synthesis delay signal SUM2_$d$ and the mode register enablement signal MRREN. The operation signal output circuit 375 may output the second read synthesis delay signal SUM2_$d$ as the mode register operation signal OP_MRR when the mode register enablement signal MRREN is enabled to have a logic "high" level. The operation signal output circuit 375 may output the second read synthesis delay signal SUM2_$d$ as the read operation signal OP_RD when the mode register enablement signal MRREN is disabled to have a logic "low" level.

The operation signal output circuit 375 may include AND gates 378_1 and 378_2 and an inverter 379_1. The AND gate 378_1 may perform a logical AND operation of the second read synthesis delay signal SUM2_$d$ and the mode register enablement signal MRREN to generate and output the mode register operation signal OP_MRR. The inverter 379_1 may inversely buffer the mode register enablement signal MRREN to generate an inverted mode register enablement signal MRRENB. The inverted mode register enablement signal MRRENB may be enabled to have a logic "high" level when the read operation is performed and may be disabled to have a logic "low" level when the mode register read operation is performed. The AND gate 378_2 may perform a logical AND operation of the second read synthesis delay signal SUM2_d and the inverted mode register enablement signal MRRENB to generate and output the read operation signal OP_RD.

Figure 16:
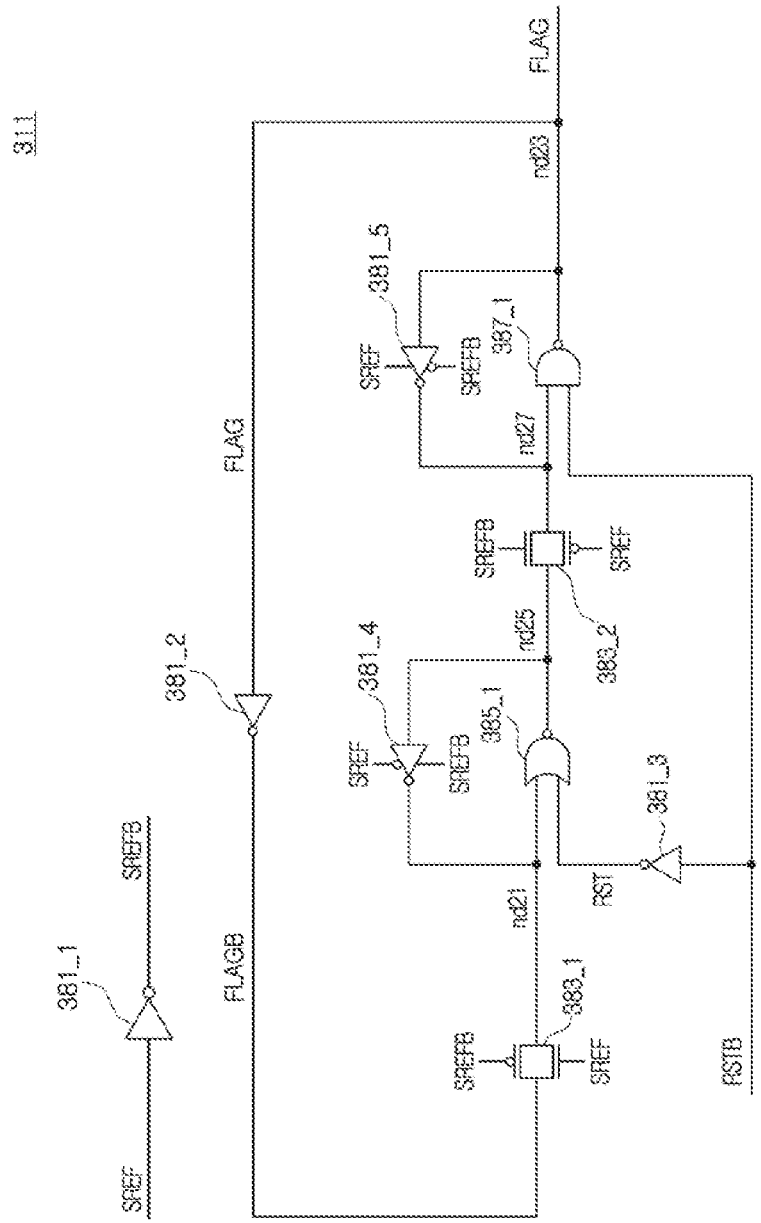
FIG. 16 is a circuit diagram illustrating a configuration of a flag generation circuit included in the electronic device illustrated in FIG. 9.

FIG. 16 is a circuit diagram illustrating a configuration of the flag generation circuit 311 included in the electronic device 120b. As illustrated in FIG. 16, whenever the self-refresh command SREF is inputted to the flag generation circuit 311, the flag generation circuit 311 may feedback an inverted flag signal FLAGB generated by inverting a level of the flag signal FLAG to an input terminal of the flag generation circuit 311 and may output the inverted flag signal FLAGB as the flag signal FLAG. The flag generation circuit 311 may feedback the inverted flag signal FLAGB generated by inverting a level of the flag signal FLAG to an input node nd21 when the self-refresh command SREF is enabled. The flag generation circuit 311 may output the inverted flag signal FLAGB, which is fed back to the input node nd21, as the flag signal FLAG through an output node nd23 when the self-refresh command SREF is disabled.

The flag generation circuit 311 may include inverters 381_1, 381_2, 381_3, 381_4, and 381_5, transfer gates 383_1 and 383_2, a NOR gate 385_1, and a NAND gate 387_1. The inverter 381_1 may inversely buffer the self-refresh command SREF to generate an inverted self-refresh command SREFB. The inverter 381_2 may inversely buffer the flag signal of the output node nd23 to generate the inverted flag signal FLAGB.

The transfer gate 383_1 may feedback the inverted flag signal FLAGB to the input node nd21 when the self-refresh command SREF is enabled to have a logic "high" level and the inverted self-refresh command SREFB is disabled to have a logic "low" level. The inverter 381_3 may inversely buffer an inverted reset signal RSTB to generate a reset signal RST. The inverted reset signal RSTB may be generated to have a logic "low" level for execution of an initialization operation. The NOR gate 385_1 may receive a signal of the input node nd21 and the reset signal RST to perform a logical NOR operation of the signal of the input node nd21 and the reset signal RST and may output a result of the logical NOR operation through a first internal node nd25. The inverter 381_4 may inversely buffer a signal of the first internal node nd25 to feedback the inversely buffered signal of the signal of the first internal node nd25 to the input node nd21 when the inverted self-refresh command SREFB is enabled to have a logic "high" level. The inverter 381_4 may be enabled when the self-refresh command SREF is disabled to have a logic "low" level and the inverted self-refresh command SREFB is enabled to have a logic "high" level.

The transfer gate 383_2 may output a signal of the first internal node nd25 to a second internal node nd27 when the self-refresh command SREF is disabled to have a logic "low" level and the inverted self-refresh command SREFB is enabled to have a logic "high" level. The NAND gate 387_1 may perform a logical NAND operation of the inverted reset signal RSTB and a signal of the second internal node nd27 to output a result of the logical NAND operation to the output node nd23. The inverter 381_5 may inversely buffer a signal of the output node nd23 to feedback the inversely buffered signal of the signal of the output node nd23 to the second internal node nd27 when the self-refresh command SREF is enabled to have a logic "high" level. The inverter 381_5 may be enabled when the self-refresh command SREF is enabled to have a logic "high" level and the inverted self-refresh command SREFB is disabled to have a logic "low" level.

Figure 17:
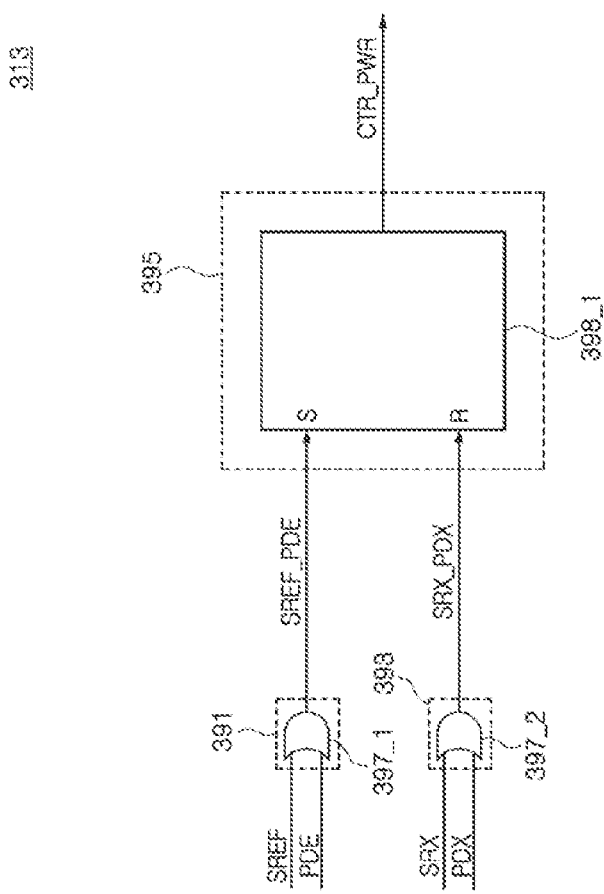
FIG. 17 is a circuit diagram illustrating a configuration of a power controller included in the electronic device illustrated in FIG. 9.

FIG. 17 is a circuit diagram illustrating a configuration of the power controller 313 included in the electronic device 120b. As illustrated in FIG. 17, the power controller 313 may include a power-down entry signal generation circuit 391, a power-down exit signal generation circuit 393, and a power control signal generation circuit 395.

The power-down entry signal generation circuit 391 may generate a power-down entry signal SREF_PDE based on the self-refresh command SREF and the power-down command PDE. The power-down entry signal SREF_PDE may be enabled to enable the power control signal CTR_PWR. The power-down entry signal generation circuit 391 may enable the power-down entry signal SREF_PDE when the self-refresh command SREF or the power-down command PDE is enabled. The power-down entry signal generation circuit 391 may include an OR gate 397_1. The OR gate 397_1 may perform a logic OR operation of the self-refresh command SREF and the power-down command PDE to generate and output the power-down entry signal SREF_PDE.

The power-down exit signal generation circuit 393 may generate a power-down exit signal SRX_PDX based on the self-refresh exit command SRX and the power-down exit command PDX. The power-down exit signal SRX_PDX may be enabled to disable the power control signal CTR_PWR. The power-down exit signal generation circuit 393 may enable the power-down exit signal SRX_PDX when the self-refresh exit command SRX or the power-down exit command PDX is enabled. The power-down exit signal generation circuit 393 may include an OR gate 397_2. The OR gate 397_2 may perform a logic OR operation of the self-refresh exit command SRX and the power-down exit command PDX to generate and output the power-down exit signal SRX_PDX.

The power control signal generation circuit 395 may generate the power control signal CTR_PWR based on the power-down entry signal SREF_PDE and the power-down exit signal SRX_PDX. The power control signal generation circuit 395 may enable the power control signal CTR_PWR when the power-down entry signal SREF_PDE is enabled. The power control signal generation circuit 395 may disable the power control signal CTR_PWR when the power-down exit signal SRX_PDX is enabled. The power control signal generation circuit 395 may include an S-R latch 398_1. The S-R latch 398_1 may generate the power control signal CTR_PWR which is enabled to have a logic "high" level when the power-down entry signal SREF_PDE is enabled to have a logic "high" level and which is disabled to have a logic "low" level when the power-down exit signal SRX_PDX is enabled to have a logic "high" level.

Figure 18:
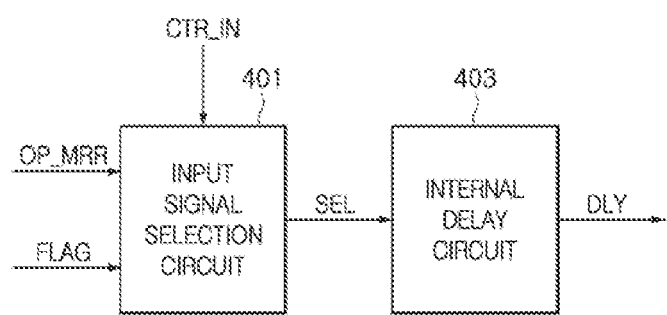
FIG. 18 is a block diagram illustrating a configuration of a delay circuit included in the electronic device illustrated in FIG. 9.

FIG. 18 is a block diagram illustrating a configuration of the delay circuit 315 included in the electronic device 120b. As illustrated in FIG. 18, the delay circuit 315 may include an input signal selection circuit 401 and an internal delay circuit 403.

The input signal selection circuit 401 may output one of the mode register operation signal OP_MRR and the flag signal FLAG as a selection signal SEL based on the input control signal CTR_IN. The input signal selection circuit 401 may output the mode register operation signal OP_MRR as the selection signal SEL when the input control signal CTR_IN is enabled. The input signal selection circuit 401 may output the flag signal FLAG as the selection signal SEL when the input control signal CTR_IN is disabled. A configuration and an operation of the input signal selection circuit 401 will be described more fully with reference to FIG. 19 later.

The internal delay circuit 403 may delay the selection signal SEL by a predetermined period to generate the delay signal DLY. A configuration and an operation of the internal delay circuit 403 will be described more fully with reference to FIG. 20 later.

Figure 19:
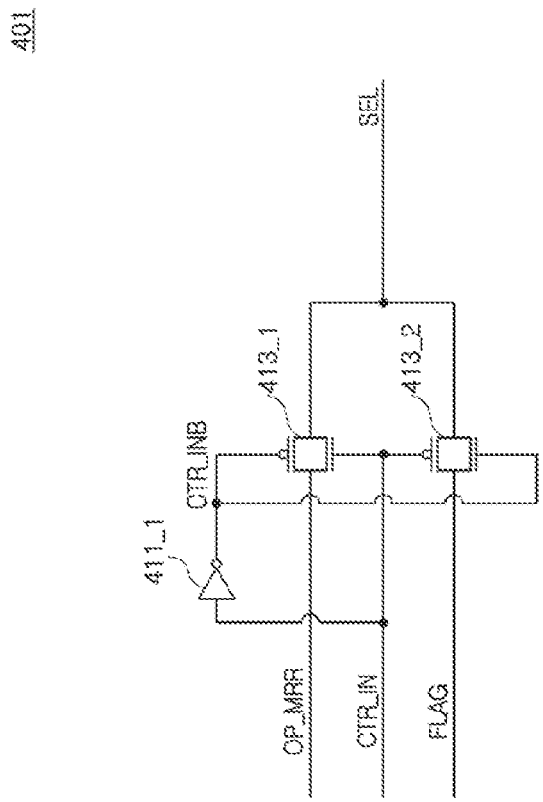
FIG. 19 is a circuit diagram illustrating a configuration of an input signal selection circuit included in the delay circuit illustrated in FIG. 18.

FIG. 19 is a circuit diagram illustrating a configuration of the input signal selection circuit 401 included in the delay circuit 315 illustrated in FIG. 18. As illustrated in FIG. 19, the input signal selection circuit 401 may include an inverter 411_1 and transfer gates 413_1 and 413_2.

The inverter 411_1 may Inversely buffer the input control signal CTR_IN to generate an inverted input control signal CTR_INB. The transfer gate 413_1 may output the mode register operation signal OP_MRR as the selection signal SEL when the input control signal CTR_IN is enabled to have a logic "high" level and the inverted input control signal CTR_INB is disabled to have a logic "low" level. The transfer gate 413_2 may output the flag signal FLAG as the selection signal SEL when the input control signal CTR_IN is disabled to have a logic "low" level and the inverted input control signal CTR_INB Is enabled to have a logic "high" level.

Figure 20:
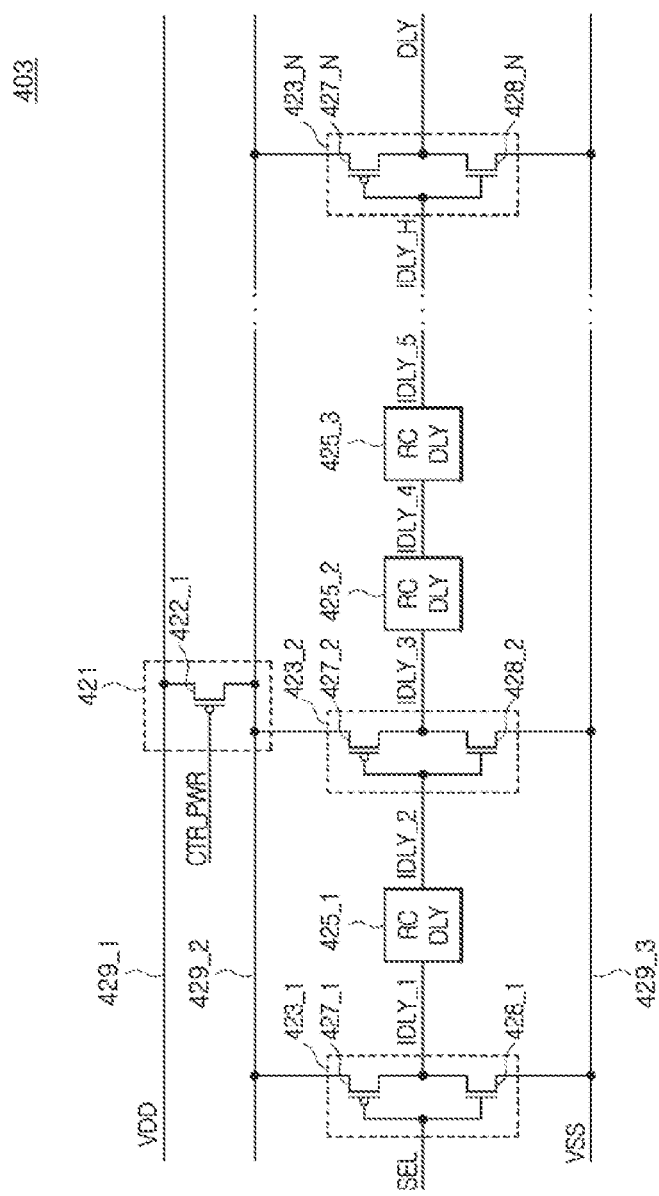
FIG. 20 illustrates a configuration of an internal delay circuit included in the delay circuit illustrated in FIG. 18.

FIG. 20 illustrates a configuration of the internal delay circuit 403 included in the delay circuit 315. As illustrated in FIG. 20, the internal delay circuit 403 may include a power interruption circuit 421, a plurality of unit delay circuits (e.g., first to $N^{th}$ unit delay circuits 423_1~423_N), a plurality of RC delay circuits (RC_DLY) 425_1, 425_2, 425_3, . . . , and a plurality of voltage supply lines (e.g., first and second voltage supply lines 429_1 and 429_3 and a virtual voltage supply line 429_2) (where, "N" is set to be a natural number which is equal to or greater than three).

The power interruption circuit 421 may control the supply of a first external voltage VDD based on the power control signal CTR_PWR. The power interruption circuit 421 may inhibit the first external voltage VDD loaded on the first voltage supply line 429_1 from being supplied to the virtual voltage supply line 429_2 coupled to the first to $N^{th}$ unit delay circuits 423_1~423_N when the power control signal CTR_PWR is enabled. The power interruption circuit 421 may supply the first external voltage VDD loaded on the first voltage supply line 429_1 to the virtual voltage supply line 429_2 when the power control signal CTR_PWR is disabled. The power interruption circuit 421 may include a PMOS transistor 422_1 coupled between the first voltage supply line 429_1 and the virtual voltage supply line 429_2. The PMOS transistor 422_1 may be turned off when the power control signal CTR_PWR has a logic "high" level and may be turned on when the power control signal CTR_PWR has a logic "low" level.

Each of the plurality of unit delay circuits 423_1~423_N may inversely buffer an input signal thereof to output an output signal thereof, which is delayed by a certain period as compared with the input signal. Each of the plurality of unit delay circuits 423_1~423_N may be realized using an inverter. Each of the plurality of unit delay circuits 423_1~423_N may include a first MOS transistor and a second MOS transistor which are coupled in series. The first MOS transistor may be realized using a PMOS transistor, and the second MOS transistor may be realized using an NMOS transistor. In each of the plurality of unit delay circuits 423_1~423_N, a gate terminal of the first MOS transistor may be coupled to a gate terminal of the second MOS transistor. One of the first MOS transistor and the second MOS transistor may be selectively turned on according to a level of the input signal applied to the gate terminals of the first MOS transistor and the second MOS transistor. In each of the plurality of unit delay circuits 423_1~423_N, a source terminal of the first MOS transistor may be coupled to the virtual voltage supply line 429_2 for supplying the first external voltage VDD, and a drain terminal of the first MOS transistor may be coupled to a drain terminal of the second MOS transistor. In addition, a source terminal of the second MOS transistor may be coupled to the second voltage supply line 429_3 for supplying a second external voltage VSS. The first external voltage VDD and the second external voltage VSS may be provided through power pads (not shown) of the electronic device 120b, respectively.

Each of the plurality of the RC delay circuits 4251, 425_2, 425_3, . . . may delay an input signal thereof by an RC delay time to output a delayed signal.

The first unit delay circuit 423_1 may inversely buffer the selection signal SEL to generate a first internal delay signal IDLY_1 which is delayed by a certain period as compared with the selection signal SEL. The first unit delay circuit 4231 may include a first MOS transistor 427_1 and a second MOS transistor 427_1 coupled in series between the virtual voltage supply line 429_2 and the second voltage supply line 429_3. One of the first MOS transistor 427_1 and the second MOS transistor 428_1 may be selectively turned on according to a level of the selection signal SEL.

The RC delay circuit 425_1 may delay the first internal delay signal IDLY_1 by an RC delay time to generate a second internal delay signal IDLY_2.

The second unit delay circuit 423_2 may inversely buffer the second internal delay signal IDLY_2 to generate a third internal delay signal IDLY_3 which is delayed by a certain period as compared with the second internal delay signal IDLY_2. The second unit delay circuit 423_2 may include a first MOS transistor 427_2 and a second MOS transistor 428_2 coupled in series between the virtual voltage supply line 429_2 and the second voltage supply line 429_3. One of the first MOS transistor 427_2 and the second MOS transistor 428_2 may be selectively turned on according to a level of the second internal delay signal IDLY_2. The first MOS transistor 427_2 may be turned on when the second MOS transistor 428_1 is turned on. The second MOS transistor 428_2 may be turned on when the first MOS transistor 427_1 is turned on.

The RC delay circuit 425_2 may delay the third internal delay signal IDLY_3 by an RC delay time to generate a fourth internal delay signal IDLY_4.

The RC delay circuit 425_3 may delay the fourth internal delay signal IDLY_4 by an RC delay time to generate a fifth internal delay signal IDLY_5.

The $N^{th}$ unit delay circuit 423_N may inversely buffer an $H^{th}$ internal delay signal IDLY_H to generate the delay signal DLY which is delayed by a certain period as compared with the $H^{th}$ internal delay signal IDLY_H (where, "H" denotes a natural number which is equal to or greater than five). The $N^{th}$ unit delay circuit 423_N may include a first MOS transistor 427_N and a second MOS transistor 428_N coupled in series between the virtual voltage supply line 429_2 and the second voltage supply line 429_3.

In the internal delay circuit 403, the first MOS transistor 427_1 and the second MOS transistor 428_2 may be turned on when the selection signal SEL has a logic "low" level. In contrast, the second MOS transistor 428_1 and the first MOS transistor 427_2 included in the internal delay circuit 403 may be turned on when the selection signal SEL has a logic "high" level. That is, when the selection signal SEL continuously has a logic "low" level or a logic "high" level, only some specific MOS transistors among the MOS transistors included in the internal delay circuit 403 may be turned on during a long time so that characteristics of the specific MOS transistors are severely degraded due to the BTI phenomenon.

According to the present embodiment, when the input control signal (CTR_IN of FIG. 18) is disabled, the internal delay circuit 403 may receive the flag signal (FLAG of FIG. 18), which is toggled based on the self-refresh command (SREF of FIG. 18), as the selection signal SEL to suppress the BTI phenomenon of the specific MOS transistors. As a result, it may be possible to increase a lifetime of the electronic device 120b, to improve the reliability of operations of the electronic device 120b, and to reduce a layout area of an extra circuit for suppressing the BTI phenomenon.

Figure 21:
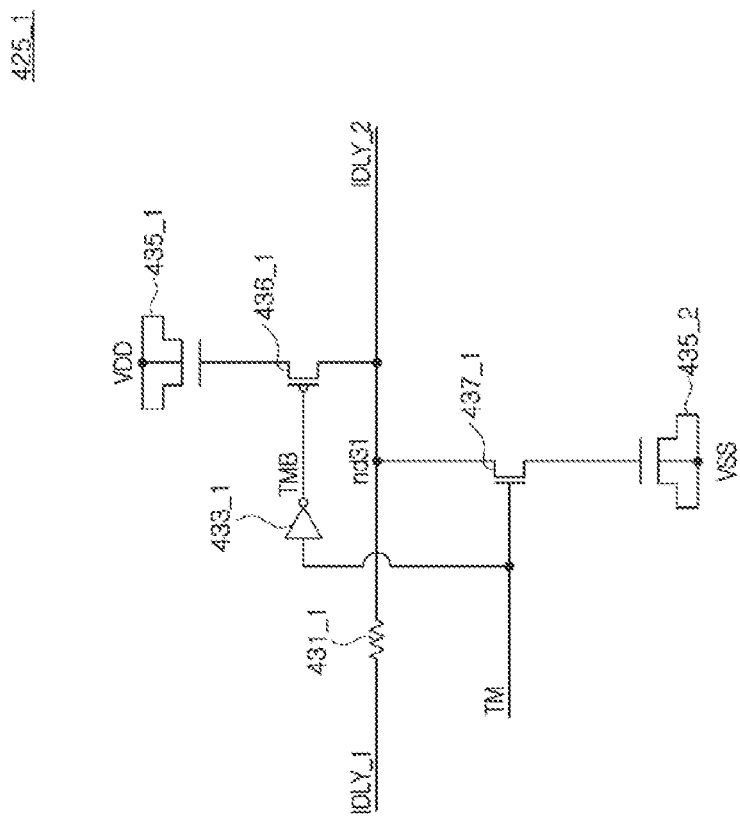
FIG. 21 is a circuit diagram illustrating a configuration of an RC delay circuit included in the internal delay circuit illustrated in FIG. 20.

FIG. 21 is a circuit diagram illustrating a configuration of the RC delay circuit 425_1 included in the internal delay circuit 403. As illustrated in FIG. 21, the RC delay circuit 425_1 may delay the first internal delay signal IDLY_1 by an RC delay time based on a test mode signal TM to generate the second internal delay signal IDLY_2 in a test mode. The test mode signal TM may be outputted from the controller (110 of FIG. 1) and may be enabled for the test mode.

The RC delay circuit 425_1 may include a resistor 431_1, an inverter 433_1, capacitors 435_1 and 435_2, a PMOS transistor 436_1, and an NMOS transistor 437_1. The resistor 431_1 may include one end receiving the first internal delay signal IDLY_1 and the other end connected to an internal node nd31. The resistor 4311 may have a constant resistance value according to different embodiments. The inverter 433_1 may inversely buffer the test mode signal TM to generate an inverted test mode signal TMB. The capacitor 435_1 may have one end receiving the first external voltage VDD and the other end connected to a source terminal of the PMOS transistor 436_1. The capacitor 435_1 may have a constant capacitance value according to different embodiments. The PMOS transistor 436_1 may receive the inverted test mode signal TMB having a logic "low" level in the test mode to be turned on. A drain terminal of the PMOS transistor 436_1 may be connected to the internal node nd31. The capacitor 435_2 may have one end receiving the second external voltage VSS and the other end connected to a source terminal of the NMOS transistor 437_1. The capacitor 435_2 may have a constant capacitance value according to an embodiment. The NMOS transistor 437_1 may receive the test mode signal TM having a logic "high" level in the test mode to be turned on. A drain terminal of the NMOS transistor 437_1 may be connected to the internal node nd31.

As described above, the RC delay circuit 425_1 may delay the first internal delay signal IDLY_1 by an RC delay time to generate the second internal delay signal IDLY_2 in the test mode because both of the PMOS transistor 436_1 and the NMOS transistor 437_1 are turned on in the test mode.

Figure 22:
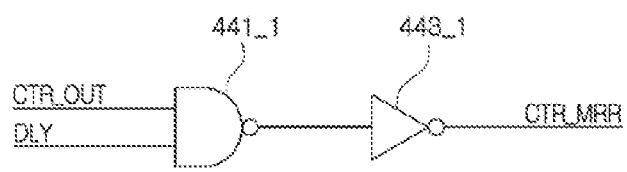
FIG. 22 is a circuit diagram illustrating a configuration of an output control circuit included in the electronic device illustrated in FIG. 9.

FIG. 22 is a circuit diagram illustrating a configuration of the output control circuit 317 included in the electronic device 120b. As illustrated in FIG. 22, the output control circuit 317 may include a NAND gate 441_1 and an inverter 443_1 which are coupled in series.

The NAND gate 441_1 may receive the out control signal CTR_OUT and the delay signal DLY to perform a logical NAND operation of the out control signal CTR_OUT and the delay signal DLY. The inverter 443_1 may inversely buffer an output signal of the NAND gate 441_1 to generate the mode register control signal CTR_MRR.

Figure 23:
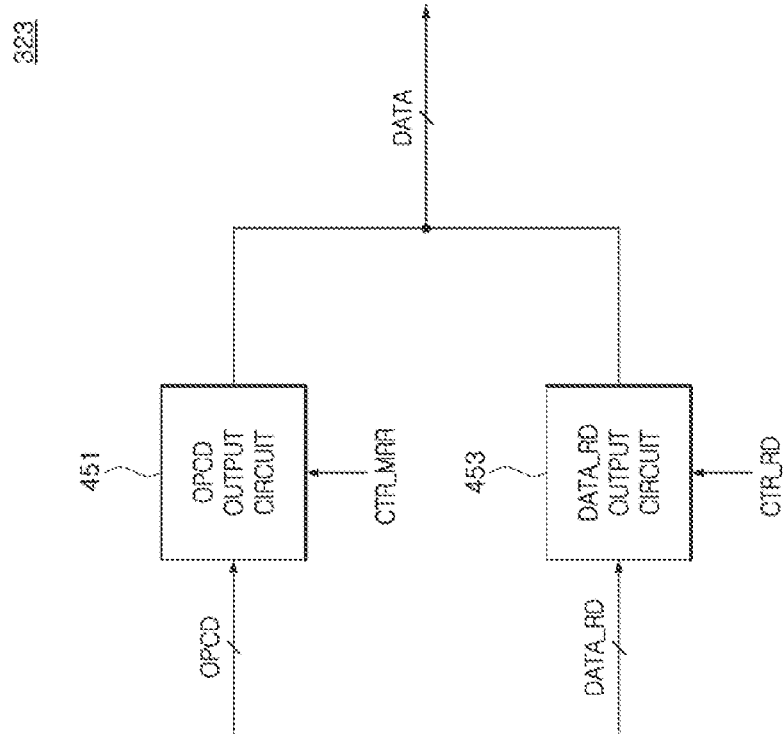
FIG. 23 is a block diagram illustrating a configuration of a data output circuit included in the electronic device illustrated in FIG. 9.

FIG. 23 is a block diagram illustrating a configuration of the data output circuit 323 included in the electronic device 120b. As illustrated in FIG. 23, the data output circuit 323 may include an operation code output circuit 451 and a read data output circuit 453.

The operation code output circuit 451 may generate the data DATA from the operation code OPCD based on the mode register control signal CTR_MRR. The operation code output circuit 451 may output the operation code OPCD as the data DATA when the mode register control signal CTR_MRR is enabled.

The read data output circuit 453 may generate the data DATA from the read data DATA_RD based on the read control signal CTR_RD. The read data output circuit 453 may output the read data DATA_RD as the data DATA when the read control signal CTR_RD is enabled.

Figure 24:
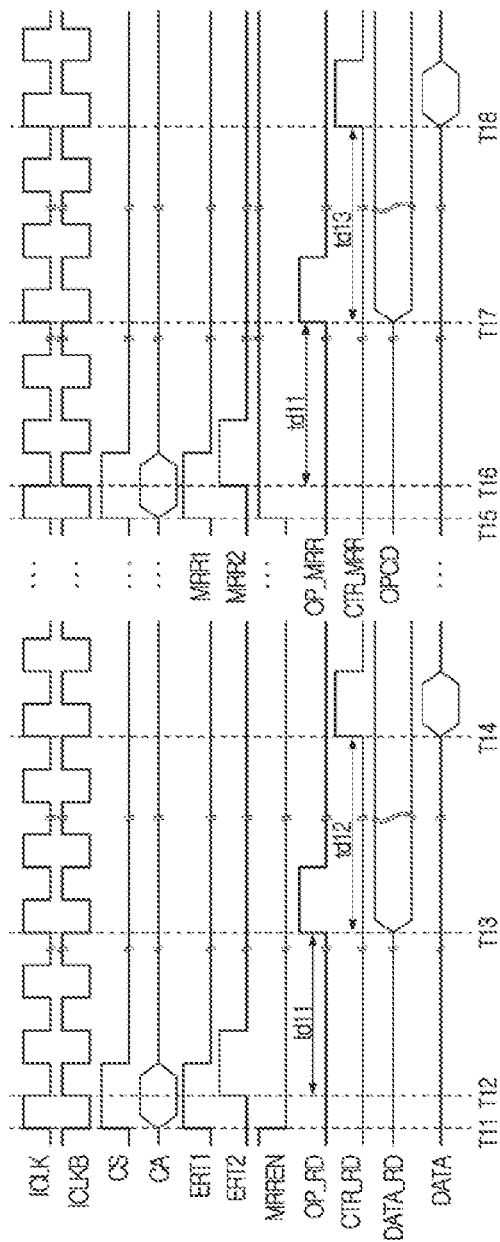
FIG. 24 is a timing diagram illustrating a read operation and a mode register read operation performed by the electronic device illustrated in FIG. 9.

FIG. 24 is a timing diagram illustrating the read operation and the mode register read operation performed by the electronic device 120b illustrated in FIG. 9.

Referring to FIG. 24, the internal clock generation circuit 301 may receive the clock signal CLK to generate the internal clock signal ICLK and the inverted internal clock signal ICLKB.

At a point in time "T11", the command generation circuit 303 may be synchronized with the internal clock signal ICLK to generate the first read command ERT1 which is enabled to have a logic "high" level based on the chip selection signal CS and the command/address signal CA having logic levels for performing the read operation.

At the point in time "T11", the operation signal output control circuit 307 may receive the first read command ERT1 having a logic "high" level to generate the mode register enablement signal MRREN which is disabled to have a logic "low" level.

At a point in time "T12", the command generation circuit 303 may be synchronized with the inverted internal clock signal ICLKB to generate the second read command ERT2 which is enabled to have a logic "high" level based on the first read command ERT1.

At a point in time "T13", the operation signal generation circuit 309 may generate the read operation signal OP_RD by delaying the second read command ERT2 by a certain period "td11" based on the mode register enablement signal MRREN which is disabled.

At the point in time "T13", the core circuit 321 may receive the read operation signal OP_RD to output the read data DATA_RD.

At a point in time "T14", the core circuit 321 may generate and output the read control signal CTR_RD by delaying the read operation signal OP_RD by a certain period "td12".

At the point in time "T14", the data output circuit 323 may receive the read control signal CTR_RD to output the read data DATA_RD as the data DATA.

At a point in time "T15", the command generation circuit 303 may be synchronized with the internal clock signal ICLK to generate the first mode register command MRR1 which is enabled to have a logic "high" level based on the chip selection signal CS and the command/address signal CA having logic levels for performing the mode register read operation.

At the point in time "T15", the operation signal output control circuit 307 may receive the first mode register command MRR1, which is enabled to have a logic "high"

level, to generate the mode register enablement signal MRREN which is enabled to have a logic "high" level.

At a point in time "T16", the command generation circuit 303 may be synchronized with the inverted internal clock signal ICLKB to generate the second mode register command MRR2 which is enabled to have a logic "high" level based on the first mode register command MRR1.

At a point in time "T17", the operation signal generation circuit 309 may generate the mode register operation signal OP_MRR by delaying the second mode register command MRR2 by the certain period "td11" based on the mode register enablement signal MRREN which is enabled.

At the point in time "T17", the mode register 319 may receive the mode register operation signal OP_MRR to output the operation code OPCD.

At a point in time "T18", the delay circuit 315 may generate the delay signal DLY by delaying the mode register operation signal OP_MRR by a predetermined period "td13". The predetermined period "td13" may be set as the period "td12" from the point in time "T13" when the read operation signal OP_RD is enabled until the point in time "T14" when the read control signal CTR_RD is enabled.

At the point in time "T18", the output control circuit 317 may output the delay signal DLY as the mode register control signal CTR_MRR.

At the point in time "T18", the data output circuit 323 may receive the mode register control signal CTR_MRR to output the operation code OPCD as the data DATA.

As described above, the electronic device 120b may include the delay circuit 315 delaying the selection signal SEL by the predetermined period "td13". Thus, a period from the point in time "T11" when the first read command ERT1 is generated until the point in time "T14" when the data DATA are outputted may be set to be the same as a period from the point in time "T15" when the first mode register command MRR1 is generated until the point in time "T18" when the data DATA are outputted.

The mode register read operation and the self-refresh operation performed by the electronic device 120b illustrated in FIG. 9 will be described hereinafter with reference to FIGS. 25 to 28.

Figure 25:
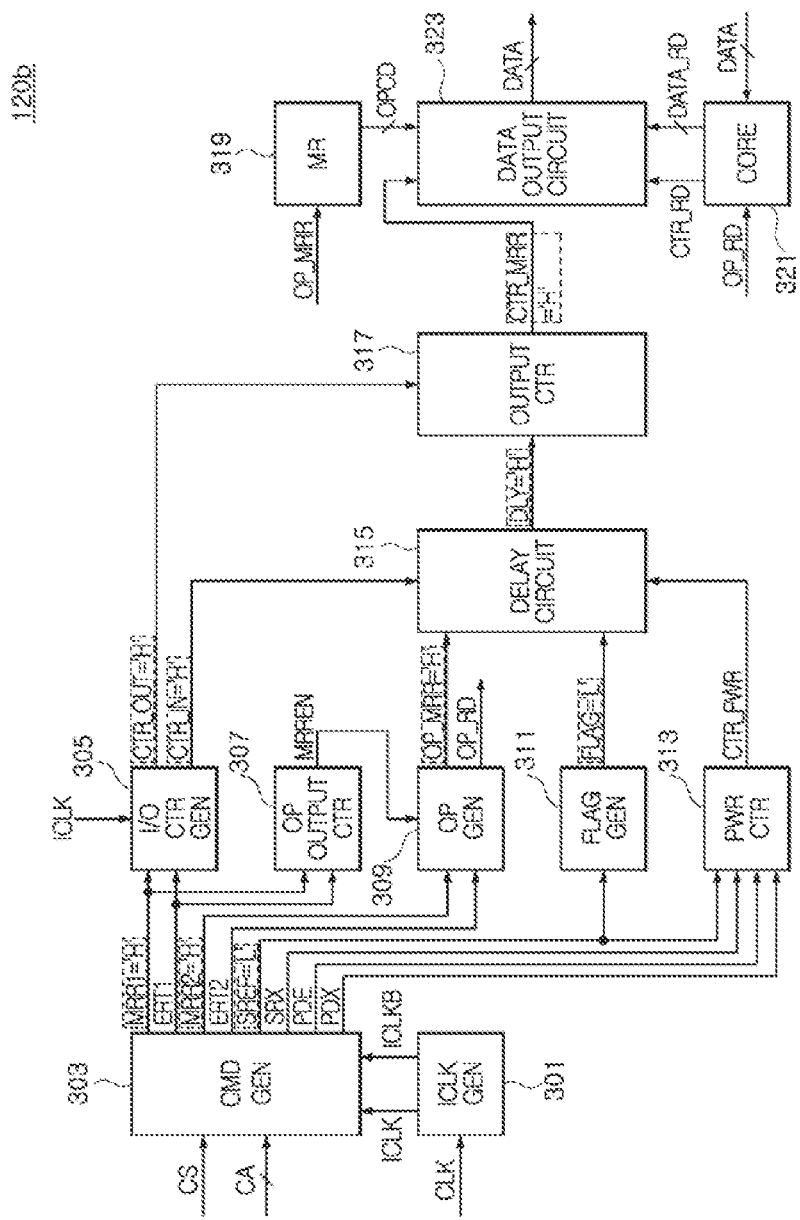
FIGS. 25 to 28 illustrate a mode register read operation and a self-refresh operation performed by the electronic device illustrated in FIG. 9.
Figure 26:
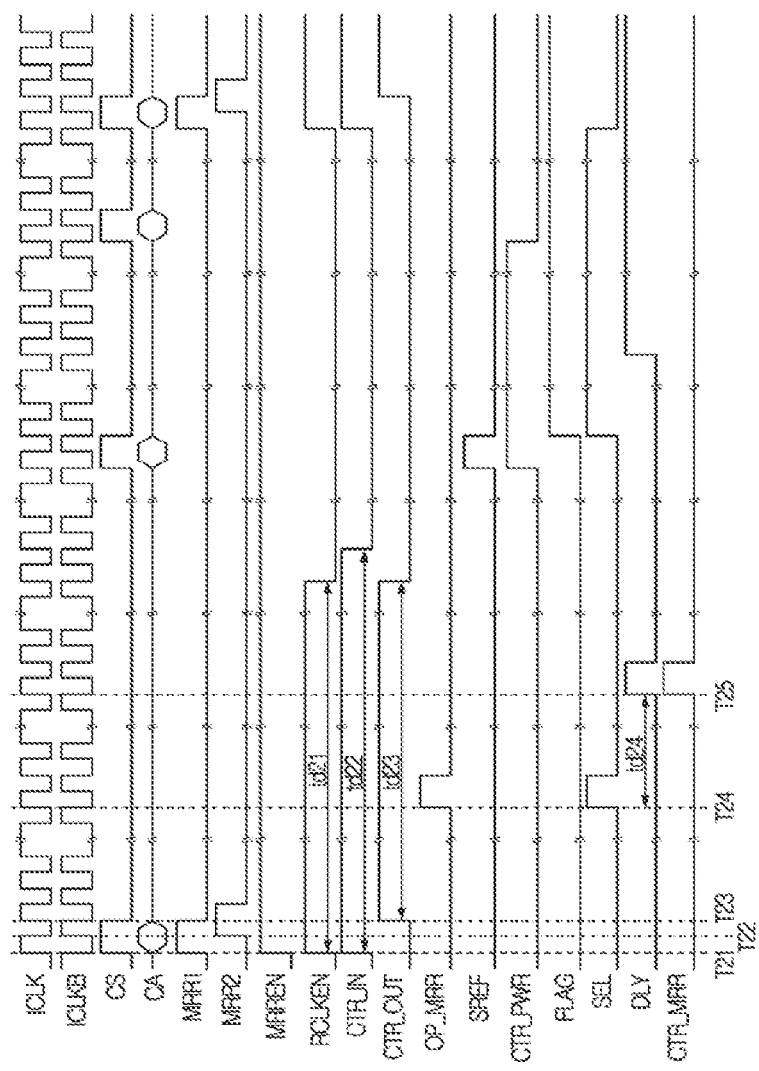

FIGS. 25 and 26 illustrate the mode register read operation performed by the electronic device 120b illustrated in FIG. 9

Referring to FIGS. 25 and 26, the internal clock generation circuit 301 may receive the clock signal CLK to generate the internal clock signal ICLK and the inverted internal clock signal ICLKB.

At a point in time "T21", the command generation circuit 303 may be synchronized with the internal clock signal ICLK to generate the first mode register command MRR1 which is enabled to have a logic "high(H)" level and the self-refresh command SREF which is disabled to have a logic "low(L)" level based on the chip selection signal CS and the command/address signal CA having logic levels for performing the mode register read operation.

At a point in time "T21", the operation signal output control circuit 307 may receive the first mode register command MRR1 having a logic "high(H)" level to generate the mode register enablement signal MRREN which is enabled to have a logic "high" level.

At the point in time "T21", the I/O control signal generation circuit 305 may generate the read clock enablement signal (RCLKEN of FIG. 12), which is enabled to have a logic "high" level during a period "td21" including a read latency period, from the first mode register command MRR1 having a logic "high(H)" level.

At the point in time "T21", the I/O control signal generation circuit 305 may generate the input control signal CTR_IN which is enabled to have a logic "high(H)" level during a period "td22" based on the read clock enablement signal (RCLKEN of FIG. 12).

At the point in time "T21", the flag generation circuit 311 may output the flag signal FLAG maintaining a logic "low(L)" level when the self-refresh command SREF, which is disabled, is inputted to the flag generation circuit 311.

At a point in time "T22", the command generation circuit 303 may be synchronized with the inverted internal clock signal ICLKB to generate the second mode register command MRR2 which is enabled to have a logic "high(H)" level based on the first mode register command MRR1.

At a point in time "T23", the I/O control signal generation circuit 305 may generate the output control signal CTR_OUT which is enabled to have a logic "high(H)" level during a period "td23" based on the read clock enablement signal (RCLKEN of FIG. 12).

At a point in time "T24", the operation signal generation circuit 309 may generate the mode register operation signal OP_MRR which is enabled to have a logic "high(H)" level based on the mode register enablement signal MRREN enabled at the point in time "T21" and the second mode register command MRR2 enabled at the point in time "T22".

At the point in time "T24", the delay circuit 315 may receive the mode register operation signal OP_MRR which is enabled based on the input control signal CTR_IN which is enabled and may generate the selection signal (SEL of FIG. 18) from the mode register operation signal OP_MRR which is enabled.

At a point in time "T25", the delay circuit 315 may generate the delay signal DLY which is enabled to have a logic "high(H)" level by delaying the selection signal (SEL of FIG. 18) by a predetermined period "td24".

At the point in time "T25", the output control circuit 317 may output the enabled delay signal DLY as the mode register control signal CTR_MRR which is enabled to have a logic "high(H)" level, based on the output control signal CTR_OUT.

Figure 27:
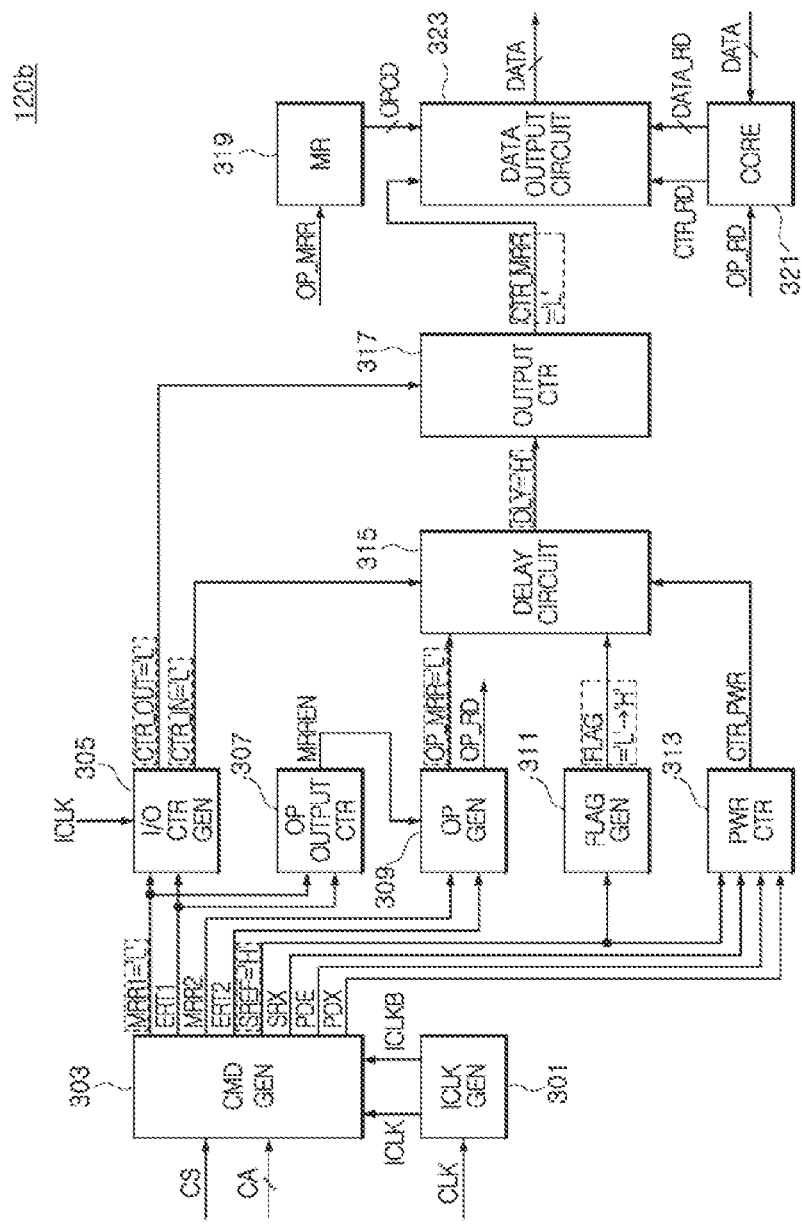
Figure 28:
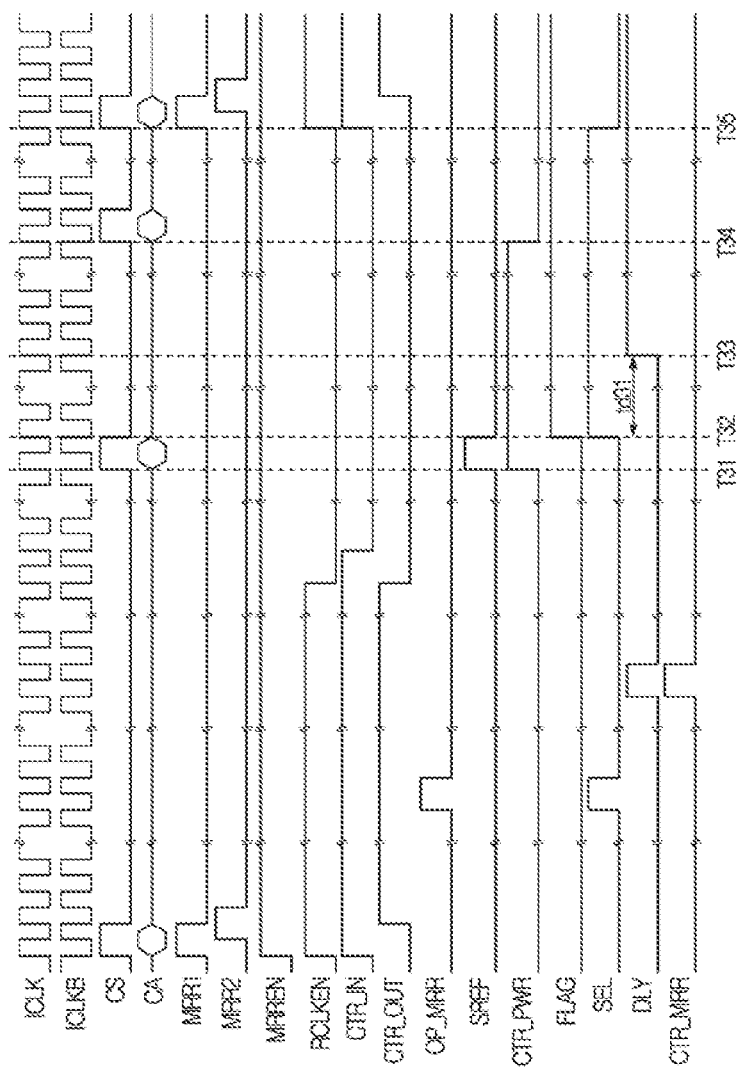

FIGS. 27 and 28 illustrate the self-refresh operation and the mode register read operation performed by the electronic device 120b illustrated in FIG. 9.

Referring to FIGS. 27 and 28, the internal clock generation circuit 301 may receive the clock signal CLK to generate the internal clock signal ICLK and the inverted internal clock signal ICLKB.

At a point in time "T31", the command generation circuit 303 may be synchronized with the internal clock signal ICLK to generate the first mode register command MRR1 which is disabled to have a logic "low(L)" level and the self-refresh command SREF which is enabled to have a logic "high(H)" level based on the chip selection signal CS and the command/address signal CA having logic levels for performing the self-refresh operation.

At a point in time "T31", the I/O control signal generation circuit 305 may generate the input control signal CTR_IN and the output control signal CTR_OUT which are disabled to have a logic "low(L)" level based on the first mode register command MRR1 which is disabled.

At the point in time "T31", the power controller 313 may generate the power control signal CTR_PWR which is enabled to have a logic "high(H)" level based on the enabled self-refresh command SREF.

At a point in time "T32", the flag generation circuit 311 may generate the flag signal FLAG whose level changes from a logic "low(L)" level into a logic "high(H)" level based on the self-refresh command SREF.

At the point in time "T32", the delay circuit 315 may receive the flag signal FLAG based on the input control signal CTR_IN which is disabled and may generate the selection signal (SEL of FIG. 18) from the flag signal FLAG.

At a point in time "T33", the delay circuit 315 may generate the delay signal DLY which is enabled to have a logic "high(H)" level by delaying the selection signal (SEL of FIG. 18) by a predetermined period "td31".

At the point in time "T33", the output control circuit 317 may generate the mode register control signal CTR_MRR which is disabled to have a logic "low(L)" level based on the output control signal CTR_OUT which is disabled.

At a point in time "T34", the command generation circuit 303 may be synchronized with the internal clock signal ICLK to generate the self-refresh exit command SRX which is enabled to have a logic "high(H)" level based on the chip selection signal CS and the command/address signal CA having logic levels for terminating the self-refresh operation.

At the point in time "T34", the power controller 313 may generate the power control signal CTR_PWR which is disabled to have a logic "low(L)" level based on the enabled self-refresh exit command SRX.

At a point in time "T35", the command generation circuit 303 may be synchronized with the internal clock signal ICLK to generate the first mode register command MRR1 which is enabled to have a logic "high(H)" level based on the chip selection signal CS and the command/address signal CA having logic levels for performing the mode register read operation.

At the point in time "T35", the I/O control signal generation circuit 305 may generate the input control signal CTR_IN which is enabled to have a logic "high(H)" level based on the first mode register command MRR1 which is enabled.

At the point in time "T35", the delay circuit 315 may disable the selection signal (SEL of FIG. 18) to a logic "low(L)" level based on the input control signal CTR_IN which is enabled.

As described above, the electronic device 120b change a level of the flag signal (FLAG of FIG. 9) whenever the self-refresh command (SREF of FIG. 9) is generated and may apply one of the mode register operation signal (OP_MRR of FIG. 9) and the flag signal (FLAG of FIG. 9) to the delay circuit (315 of FIG. 9) according to whether the mode register read operation is performed. As a result, in the delay circuit 315, degradation of the MOS transistors due to the BTI phenomenon may be suppressed or mitigated to increase a lifetime of the electronic device 120b, to improve the reliability of operations of the electronic device 120b, and to reduce a layout area of an extra circuit for suppressing the BTI phenomenon.

Figure 29:
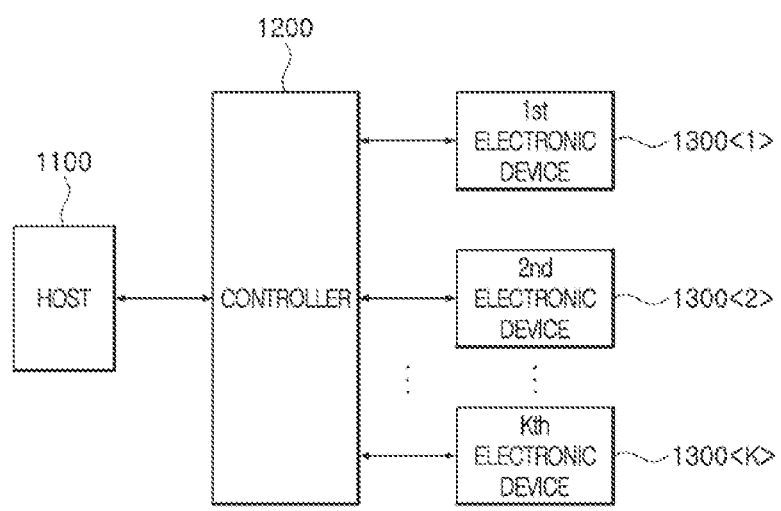
FIG. 29 is a block diagram illustrating a configuration of an electronic system according to another embodiment of the present disclosure.

FIG. 29 is a block diagram illustrating a configuration of an electronic system 1000 according to an embodiment of the present disclosure. As illustrated in FIG. 29, the electronic system 1000 may include a host 1100, a controller 1200, and first to $K^{th}$ electronic devices 1300<1:K> (where, "K" is a natural number which is equal to or greater than three).

The host 1100 and the controller 1200 may transmit signals to each other using an interface protocol. The interface protocol used for communication between the host 1100 and the controller 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (PATA), a serial attached SCSI (SAS), and a universal serial bus (USB).

The controller 1200 may control the first to $K^{th}$ electronic devices 1300<1:K> such that each of the first to $K^{th}$ electronic devices 1300<1:K> performs various internal operations including a read operation, a mode register read operation, and a self-refresh operation.

The controller 1200 may be realized using the controller 110 illustrated in FIG. 1, and each of the first to $K^{th}$ electronic devices 1300<1:K> may be realized using the electronic device 120 illustrated in FIG. 1. Each of the first to $K^{th}$ electronic devices 1300<1:K> may change a level of the flag signal (FLAG of FIG. 2 or 9) whenever the second internal command (ICMD2 of FIG. 2) or the self-refresh command (SREF of FIG. 9) is generated and may apply one of the operation signal (OP of FIG. 2) and the flag signal (FLAG of FIG. 2) or one of the mode register operation signal (OP_MRR of FIG. 9) and the flag signal (FLAG of FIG. 9) to the delay circuit (209 of FIG. 2 or 315 of FIG. 9) according to whether a predetermined operation is performed. As a result, the degradation of MOS transistors in the electronic device 120 due to the BTI phenomenon may be suppressed or mitigated to increase a lifetime of the electronic device 120, to improve the reliability of operations of the electronic device 120, and to reduce a layout area of a circuit for suppressing the BTI phenomenon.

In some embodiments, each of the first to $K^{th}$ electronic devices 1300<1:K> may be realized using one of dynamic random access memory (DRAM), phase change random access memory (PRAM), resistive random access memory (RRAM), magnetic random access memory (MRAM), and ferroelectric random access memory (FRAM).

What is claimed is:

1. An electronic device comprising:
   a flag generation circuit configured to generate a flag signal, wherein a level of the flag signal changes based on a first internal command; and
   a delay circuit configured to generate a delay signal by delaying one of an operation signal and the flag signal by a predetermined period according to whether a predetermined operation is performed.

2. The electronic device of claim 1 further comprising a command generation circuit configured to enable the first internal command to perform a self-refresh operation.

3. The electronic device of claim 1, wherein the flag generation circuit is further configured to change a level of the flag signal whenever the first internal command is enabled.

4. The electronic device of claim 1 further comprising an operation signal generation circuit configured to enable the operation signal when a second internal command for performing the predetermined operation is enabled.

5. The electronic device of claim 1, wherein the delay circuit includes:
   an input signal selection circuit configured to output one of the operation signal and the flag signal as a selection signal based on an input control signal which is enabled when the predetermined operation is performed; and
   an internal delay circuit configured to delay the selection signal by the predetermined period to generate the delay signal.

6. The electronic device of claim 5, wherein the input signal selection circuit is configured to:
   output the operation signal as the selection signal when the input control signal is enabled; and output the flag signal as the selection signal when the input control signal is disabled.

7. The electronic device of claim 5, wherein the internal delay circuit includes:
a first unit delay circuit configured to selectively turn on a first MOS transistor and a second MOS transistor included in the first unit delay circuit according to a level of the selection signal; and
a second unit delay circuit configured to turn on a first MOS transistor included in the second unit delay circuit when the second MOS transistor included in the first unit delay circuit is turned on and configured to turn on a second MOS transistor included in the second unit delay circuit when the first MOS transistor included in the first unit delay circuit is turned on.

8. The electronic device of claim 5, further comprising an output control circuit configured to output the delay signal as an operation control signal or to disable the operation control signal based on an output control signal,
wherein the output control signal is enabled when the predetermined operation is performed.

9. The electronic device of claim 8, further comprising an input/output (I/O) control signal generation circuit configured to:
generate an operation enablement signal which is enabled while the predetermined operation is performed from a point in time when a second internal command for performing the predetermined operation is enabled; and
adjust a pulse width of the operation enablement signal to generate the input control signal and the output control signal having different pulse widths.

10. The electronic device of claim 9, wherein the I/O control signal generation circuit is further configured to generate the input control signal having a pulse width which is greater than a pulse width of the output control signal.

11. An electronic device comprising:
an input/output (I/O) control signal generation circuit configured to generate an input control signal and an output control signal when a read operation or a mode register read operation is performed;
a delay circuit configured to generate a delay signal by delaying one of a mode register operation signal for the mode register read operation and a flag signal by a predetermined period based on the input control signal; and
an output control circuit configured to generate, from the delay signal based on the output control signal, a mode register control signal for controlling the mode register read operation.

12. The electronic device of claim 11, wherein the I/O control signal generation circuit is further configured to:
generate a read clock enablement signal when the read operation or the mode register read operation is performed; and
adjust a pulse width of the read clock enablement signal to generate the input control signal and the output control signal having different pulse widths.

13. The electronic device of claim 12, wherein the I/O control signal generation circuit is further configured to enable the read clock enablement signal during a period including a read latency period from a point in time when a read command for performing the read operation or a mode register read command for performing the mode register read operation is enabled.

14. The electronic device of claim 12, wherein the I/O control signal generation circuit is further configured to generate the input control signal having a pulse width which is greater than a pulse width of the output control signal.

15. The electronic device of claim 11 further comprising an operation signal generation circuit configured to enable the mode register operation signal to output an operation code stored in a mode register when the mode register read operation is performed; and
wherein the output control circuit is further configured to enable the mode register control signal to output the operation code as data when the mode register read operation is performed.

16. The electronic device of claim 11 further comprising a flag generation circuit configured to change a level of the flag signal based on a self-refresh command which is enabled when a self-refresh operation is performed.

17. The electronic device of claim 11,
wherein the delay circuit is further configured to delay one of the mode register operation signal and the flag signal by the predetermined period which is set as a period from a point in time when a read operation signal is enabled until a point in time when a read control signal is enabled when the read operation is performed,
wherein the read operation signal is enabled to output storage data stored in a cell array included in a core circuit as read data; and
wherein the read control signal is enabled to output the read data as data when the read operation is performed.

18. The electronic device of claim 11, wherein the delay circuit includes:
an input signal selection circuit configured to output the mode register operation signal as a selection signal when the input control signal is enabled and configured to output the flag signal as the selection signal when the input control signal is disabled; and
an internal delay circuit configured to delay the selection signal by the predetermined period to generate the delay signal.

19. The electronic device of claim 18, wherein the internal delay circuit includes:
a first unit delay circuit configured to selectively turn on one of a first MOS transistor and a second MOS transistor included in the first unit delay circuit according to a level of the selection signal; and
a second unit delay circuit configured to turn on a first MOS transistor included in the second unit delay circuit when the second MOS transistor included in the first unit delay circuit is turned on and configured to turn on a second MOS transistor included in the second unit delay circuit when the first MOS transistor included in the first unit delay circuit is turned on.

20. The electronic device of claim 11, wherein the output control circuit is configured to:
output the delay signal as the mode register control signal when the output control signal is enabled; and
disable the mode register control signal when the output control signal is disabled.

* * * * *